US012137586B2

(12) United States Patent
Chen et al.

(10) Patent No.: US 12,137,586 B2
(45) Date of Patent: Nov. 5, 2024

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Yipeng Chen, Beijing (CN); Ling Shi, Beijing (CN); Ke Liu, Beijing (CN); Zhenhua Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 593 days.

(21) Appl. No.: 17/432,951

(22) PCT Filed: Nov. 18, 2020

(86) PCT No.: PCT/CN2020/129817
§ 371 (c)(1),
(2) Date: Aug. 23, 2021

(87) PCT Pub. No.: WO2022/104600
PCT Pub. Date: May 27, 2022

(65) Prior Publication Data
US 2022/0352288 A1 Nov. 3, 2022

(51) Int. Cl.
*H10K 59/131* (2023.01)
*H10K 59/121* (2023.01)
(Continued)

(52) U.S. Cl.
CPC ....... *H10K 59/131* (2023.02); *H10K 59/1213* (2023.02); *H10K 59/1216* (2023.02);
(Continued)

(58) Field of Classification Search
CPC ............. H10K 59/131; H10K 59/1213; H10K 59/1216; H10K 59/126; H10K 59/179; H10K 59/353
See application file for complete search history.

(56) References Cited

U.S. PATENT DOCUMENTS 6,992,732 B2   1/2006 Kim et al.
2020/0212163 A1*  7/2020 Lou .................. H10K 59/176
(Continued)

FOREIGN PATENT DOCUMENTS

CN      109801950 A    5/2019
CN      110265472 A    9/2019
(Continued)

*Primary Examiner* — Syed I Gheyas
(74) *Attorney, Agent, or Firm* — Ling Wu; Stephen Yang; Ling and Yang Intellectual Property

(57) ABSTRACT

Provided are a display substrate, a preparation method thereof, and a display apparatus. The display substrate includes: a first display region and a second display region; the first display region includes a plurality of first pixels, wherein the first pixel includes a passive light-emitting device, the second display region includes a plurality of second pixels, wherein the second pixel includes an active light-emitting device and a pixel drive circuit electrically connected to the active light-emitting device. The first display region includes a plurality of first driving signal wire groups, each first driving signal wire group corresponds to a first pixel row. The first pixel row includes one row of the first pixels, and each first driving signal group includes a plurality of first driving signal wires.

18 Claims, 11 Drawing Sheets

(51) Int. Cl.
*H10K 59/126* (2023.01)
*H10K 59/179* (2023.01)
*H10K 59/35* (2023.01)
*H10K 59/12* (2023.01)

(52) U.S. Cl.
CPC ......... *H10K 59/126* (2023.02); *H10K 59/179* (2023.02); *H10K 59/353* (2023.02); *H10K 59/1201* (2023.02)

(56) References Cited

U.S. PATENT DOCUMENTS

| | | |
|---|---|---|
| 2020/0251539 A1 | 8/2020 | Fu |
| 2020/0303472 A1 | 9/2020 | Lou et al. |
| 2021/0020706 A1 | 1/2021 | Chen |
| 2021/0200263 A1* | 7/2021 | Hu .......................... G06F 1/189 |
| 2021/0376047 A1 | 12/2021 | Xue et al. |
| 2022/0165814 A1* | 5/2022 | Rieutort-Louis ...... H10K 59/40 |

FOREIGN PATENT DOCUMENTS

| | | |
|---|---|---|
| CN | 110634930 A | 12/2019 |
| CN | 110767167 A | 2/2020 |
| CN | 110911440 A | 3/2020 |
| CN | 111276055 A | 6/2020 |
| CN | 111584591 A | 8/2020 |
| CN | 111710276 A | 9/2020 |

* cited by examiner (a1)

(b1)

(a2)                                                      (b2)

DISPLAY SUBSTRATE AND PREPARATION METHOD THEREOF, AND DISPLAY APPARATUS

TECHNICAL FIELD

Embodiments of the present disclosure relate to but are not limited to a display substrate, a preparation method thereof and a display apparatus.

BACKGROUND

Full-screen has become a main display mode of mobile phones. However, mobile phones need to be equipped with front cameras, infrared sensors and other components, which is not conducive to the design of full screen. It is needed to provide a full screen which is convenient for placing cameras, infrared sensors and other components.

SUMMARY

The following is a summary of subject matter described in detail herein. This summary is not intended to limit the protection scope of the claims.

In one aspect, an embodiment of the present disclosure provides a display substrate, including: a first display region and a second display region; the first display region includes a plurality of first pixels, wherein the first pixel includes a passive light-emitting device, the second display region includes a plurality of second pixels, wherein the second pixel includes an active light-emitting device and a pixel drive circuit electrically connected to the active light-emitting device. the first display region includes a plurality of first driving signal wire groups, one first driving signal wire group corresponds to a first pixel row; the first pixel row includes one row of the first pixels, and the first driving signal group includes a plurality of first driving signal wires, which is connected to the anode of the passive light-emitting device of the first pixel of the corresponding first pixel row; the first display region includes an anti-diffraction region, which is provided with an anti-diffraction structure, and the anti-diffraction structure is configured to reduce the diffraction intensity of the first driving signal wire group.

In an exemplary embodiment, the anti-diffraction structure includes a plurality of shield parts, which correspond to the first driving signal wire group one-to-one, and the shield part is located on one side of the first driving signal wire group close to the substrate of the display substrate;

on a plane parallel to the substrate, in the anti-diffraction region, an orthographic projection of the first driving signal wire of the first driving signal wire group is located in an orthographic projection of the corresponding shield part.

In an exemplary embodiment, the pixel drive circuit includes a gate electrode, a first capacitor electrode, a second capacitor electrode, a source electrode and a drain electrode, wherein the first capacitor electrode and the second capacitor electrode form a storage capacitor, the first driving signal wire is disposed in the same layer as the source electrode and the drain electrode, and the shield part is disposed in the same layer as the second capacitor electrode.

In an exemplary embodiment, the first driving signal wire group further includes a connecting lead connecting the first driving signal wire and the anode of the passive light-emitting device through a via.

In an exemplary embodiment, the anti-diffraction region includes N rows of first pixels and N shield parts corresponding to the N rows of first pixels one by one; on a plane parallel to the substrate, the i-th distance between a first boundary of an orthographic projection of the i-th shield part and an orthographic projection of a reference line of a first pixel row corresponding to the i-th shield part is the same as the (K+i)-th distance between the first boundary of an orthographic projection of the (K+i)-th shield part and an orthographic projection of a reference line of the first pixel row corresponding to the (K+i)-th shield part; and the distances between the first boundaries of orthographic projections of the consecutive K shield parts and orthographic projections of the reference lines of the first pixel rows corresponding to the shield parts are different from each other, wherein K is a preset value, i is 1 to N-K, and K is less than N; the reference line of the first pixel row is parallel to a first direction and includes the boundary point of the pixel opening region of the first pixel row closest to a first side of the first display region; the first boundary is the boundary of the shield part close to the first side, and the first direction is the extending direction of the first pixel row.

In an exemplary embodiment, the K is greater than or equal to 8.

In an exemplary embodiment, when K=8, on a plane parallel to the substrate, the distance between the first boundary of an orthographic projection of the first shield part and an orthographic projection of the reference line of the first pixel row corresponding to the first shield part is 107/127±10% reference units;

the distance between the first boundary of an orthographic projection of the second shield part and an orthographic projection of the reference line of the first pixel row corresponding to the second shield part is 117/127±10% reference units;

the distance between the first boundary of an orthographic projection of the third shield part and an orthographic projection of the reference line of the first pixel row corresponding to the third shield part is 90/127±10% reference units;

the distance between the first boundary of an orthographic projection of the fourth shield part and an orthographic projection of the reference line of the first pixel row corresponding to the fourth shield part is 118/127±10% reference units;

the distance between the first boundary of an orthographic projection of the fifth shield part and an orthographic projection of the reference line of the first pixel row corresponding to the fifth shield part is 75/127±10% reference units;

the distance between the first boundary of an orthographic projection of the sixth shield part and an orthographic projection of the reference line of the first pixel row corresponding to the sixth shield part is 118/127±10% reference units;

the distance between the first boundary of an orthographic projection of the seventh shield part and an orthographic projection of the reference line of the first pixel row corresponding to the seventh shield part is 59/127±10% reference units;

the distance between the first boundary of an orthographic projection of the eighth shield part and an orthographic projection of the reference line of the first pixel row corresponding to the eighth shield part is 91/127±10% reference units; and the reference unit is determined according to the size of an orthographic projection of the first pixel parallel to the substrate.

In an exemplary embodiment, the first driving signal wire group includes three first driving signal wires, wherein the first pixel includes a first color sub-pixel, a second color sub-pixel and a third color sub-pixel, and the anodes of the passive light-emitting devices of same color sub-pixels of the first pixels in the same row are electrically connected to one of the first driving signal wires.

In an exemplary embodiment, the first color sub-pixel and the second color sub-pixel are disposed in the same row, and the third color sub-pixel is located in a row adjacent to a row where the first color sub-pixel and the second color sub-pixel are located; the row where the first color sub-pixel is located and the row where the third color sub-pixel is located are alternately disposed in the first display region;

on a plane parallel to the substrate, in a same first pixel, when the shortest distance between the first driving signal wire and the pixel opening region of the passive light-emitting device of the first pixel is larger than a preset distance, an orthographic projection of the connecting lead connected by the first driving signal wire is overlapped with an orthographic projection of the pixel opening region of the third color sub-pixel of the first pixel.

In an exemplary embodiment, the anti-diffraction structure includes the first driving signal wire group, and the cross-sectional shape of the first driving signal wire in the anti-diffraction region includes a sinusoidal curve on a plane parallel to the substrate of the display substrate.

In an exemplary embodiment, in a same first driving signal wire group, the first driving signal wires are parallel to each other, the distances between adjacent first driving signal wires are the same, and the widths of the first driving signal wires are the same.

In an exemplary embodiment, on a plane parallel to the substrate, a distance between the starting point and the ending point of the sinusoidal curve in one cycle is 0.9 to 1.1 reference units, and the amplitude of the sinusoidal curve is 10/127±10% reference units, and the reference units are determined according to the size of an orthographic projection of the first pixel on a plane parallel to the substrate.

In an exemplary embodiment, the widths of the first driving signal wire is 6.2/127±10% reference units.

In an exemplary embodiment, the distance of the adjacent first driving signal wires is 5.8/127±10% reference units.

In an exemplary embodiment, the first pixel includes a first color sub-pixel, a second color sub-pixel and a third color sub-pixel; the first color sub-pixel and the second color sub-pixel are disposed in the same row, and the third color sub-pixel is located in an adjacent row of the row where the first color sub-pixel and the second color sub-pixel are located; and, the row where the first color sub-pixel is located and the row where the third color sub-pixel is located are alternately disposed in the first display region.

In an exemplary embodiment, on a plane parallel to the substrate, an orthographic projection of the first driving signal wire group is overlapped with the orthographic projection of the pixel opening region of the first color sub-pixel and the pixel opening region of the second color sub-pixel of the corresponding first pixel row, and is located outside an orthographic projection of the pixel opening region of the third color sub-pixel.

In another aspect, an embodiment of the present disclosure provides a display apparatus, which includes the display substrate described above.

In an exemplary embodiment, the display apparatus includes a sensor device, at least one of which is disposed in the anti-diffraction region, and the photosensitive surface of the sensor device is the same as the light-emitting side of the display substrate.

In yet another aspect, an embodiment of the present disclosure further provides a preparation method for a display substrate including a first display region and a second display region; the first display region includes an anti-diffraction region, and the first display region includes a plurality of first pixels, wherein the first pixel includes a passive light-emitting device, the second display region includes a plurality of second pixels, wherein the second pixel includes an active light-emitting device and a pixel drive circuit electrically connected to the active light-emitting device; and the preparation method includes:

forming a plurality of first driving signal wire groups in the first display region of the substrate, and forming an anti-diffraction structure configured to reduce the diffraction intensity of the first driving signal wire group in the anti-diffraction region of the substrate, wherein one first driving signal wire group corresponds to a row of first pixels, and the first driving signal wire group includes a plurality of first driving signal wires; forming the pixel drive circuit in the second display region of the substrate;

forming a passive light-emitting device including an anode, a light-emitting layer and a cathode in the first display region of the substrate, wherein the anode of the passive light-emitting device is connected to a first driving signal wire of a corresponding first driving signal group; forming an active light-emitting device in the second display region of the substrate.

In an exemplary embodiment, forming an anti-diffraction structure in the anti-diffraction region of the substrate includes:

forming a plurality of shield parts on the substrate;

forming first driving signal wires of the first driving signal wire group on one side of the shield part away from the substrate, wherein the shield parts corresponds to the first driving signal wire groups one by one; on a plane parallel to the substrate, in the anti-diffraction region, an orthographic projection of the first driving signal wire of the first driving signal wire group is located in an orthographic projection of the corresponding shield part.

In an exemplary embodiment, the cross-sectional shape of the first driving signal wire in the anti-diffraction region includes a sinusoidal curve on a plane parallel to the substrate of the display substrate.

Other aspects will become apparent upon reading and understanding accompanying drawings and the detailed description.

DETAILED DESCRIPTION

Figure 1:
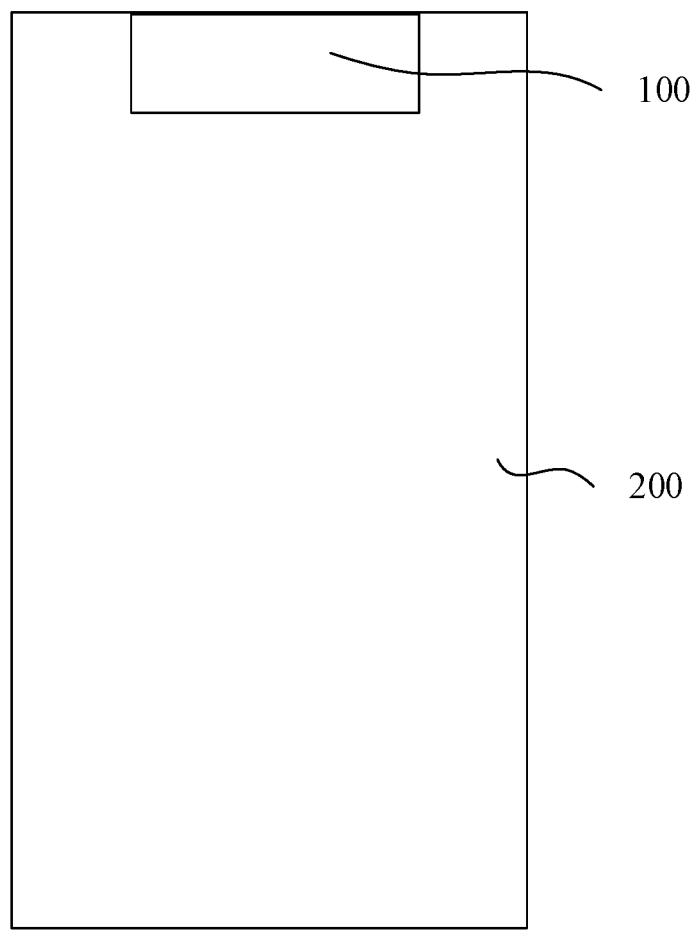
FIG. 1 is a schematic diagram of a display substrate according to an embodiment of the present disclosure.

Hereinafter embodiments of the present disclosure will be described in detail with reference to the accompanying drawings. The embodiments in the present disclosure and features in the embodiments can be combined with each other arbitrarily if there is no conflict.

In the drawings, sizes of various constituent elements and thicknesses and regions of layers are sometimes exaggerated for clarity. Therefore, an implementation of the present disclosure is not necessarily limited to the size shown, and the shapes and sizes of the components in the drawings do not reflect true proportions. In addition, the drawings schematically show ideal examples, and an implementation of the present disclosure is not limited to the shapes or values shown in the drawings.

The ordinal numbers "first", "second", "third" and the like in this specification are used to avoid confusion between constituent elements, but not to constitute limitations on quantities.

In this specification, for sake of convenience, wordings, such as "central", "upper", "lower", "front", "rear", "vertical", "horizontal", "top", "bottom", "inner", "outer" and the like which are used to indicate orientational or positional relations, to describe the positional relations between constituent elements with reference to the drawings, are only for a purpose of facilitating description of this specification and simplifying the description, rather than indicating or implying that the device or element referred to must have a specific orientation, or must be constructed and operated in a particular orientation, and therefore cannot be construed as limitations on the present disclosure. The positional relations between the constituent elements are appropriately changed according to the directions of the constituent element described. Therefore, the wordings are not limited in the specification, and may be replaced appropriately according to situations.

In this specification, terms "install", "connect" and "couple" shall be understood in a broad sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art can understand the specific meanings of the above terms in the present disclosure according to specific situations.

In this specification, an "electrical connection" includes a case where constituent elements are connected together through an element with a certain electric action. The "element with a certain electric action" is not particularly limited as long as it can transmit and receive electrical signals between the connected constituent elements. Examples of the "element with a certain electric action" include not only electrodes and wirings, but also switching elements such as transistors, resistors, inductors, capacitors, and other elements having various functions.

In this specification, "parallel" refers to a case where an angle formed by two straight lines is above −10 degrees and below 10 degrees, and thus also includes a case where the angle is above −5 degrees and below 5 degrees. In addition, "perpendicular" refers to a case where an angle formed by two straight lines is above −80 degrees and below 100 degrees, and thus also includes a case where the angle is above −85 degrees and below 95 degrees.

In this specification, "film" and "layer" may be interchangeable. For example, sometimes "conductive layer" may be replaced by "conductive film". Similarly, "insulating film" may sometimes be replaced by "insulating layer".

Figure 2:
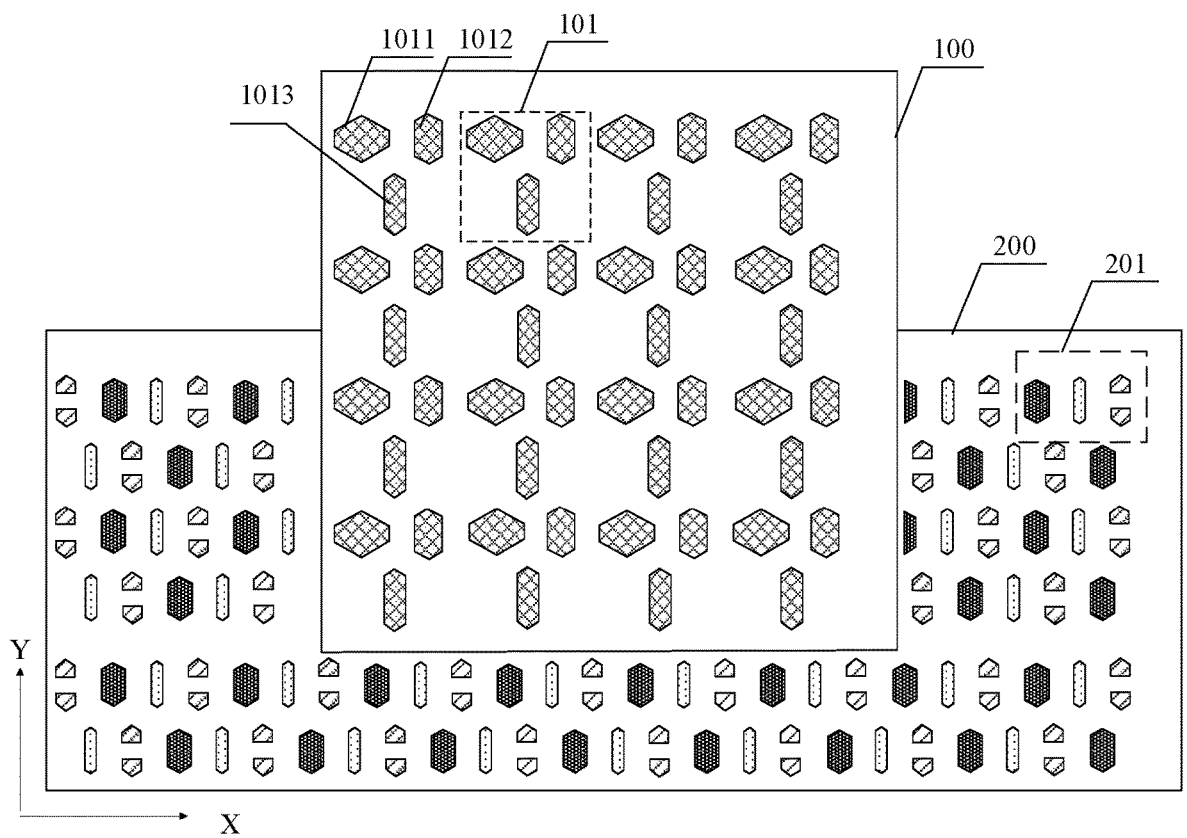
FIG. 2 is a schematic diagram of a display substrate according to an exemplary embodiment.

FIG. 1 and FIG. 2 are schematic diagrams of a display substrate according to embodiments of the present disclosure. Region 100 in FIG. 2 is an enlarged view and only illustrates part of region 100 in FIG. 1, while region 200 in FIG. 2 illustrates only part of region 200 in FIG. 1. As shown in FIGS. 1-2, the display substrate may include: a first display region 100 and a second display region 200; the first display region 100 includes a plurality of first pixels 101, wherein the first pixel 101 includes a passive light-emitting device (not shown in FIGS. 1-2), the second display region 200 includes a plurality of second pixels 201, wherein the second pixel 201 includes an active light-emitting device and a pixel drive circuit electrically connected to the active light-emitting device (not shown in FIGS. 1-2).

In an exemplary embodiment, the active light-emitting device includes a light-emitting device in an active driving light-emitting mode, and a pixel drive circuit is used for controlling the light-emitting device to emit light. The passive light-emitting device includes a light-emitting device in a passive driving light-emitting mode, and a driving signal is directly applied to the light-emitting device through a driving signal wire without a pixel drive circuit.

According to the display substrate provided in the present embodiment, the passive light-emitting device is disposed in the first display region. Since the passive light-emitting device does not need to be provided with a pixel drive circuit, there will be no pixel drive circuit or related metal wiring placed in the first display region, thus the light transmittance is high, and it is convenient to place front cameras, sensors (such as face recognition sensors, etc.), earphones and other elements, achieving a comprehensive screen design while increasing the screen ratio.

In an exemplary embodiment, the cathode materials of the active light-emitting device and the passive light-emitting device may be the same, and may be formed by one-time evaporation process. Exemplarily, materials of cathodes of active and passive light-emitting devices may be metal materials, such as magnesium (Mg), modified Mg, aluminum (al), gold (Au), silver (Ag), and so on, which are not limited here. In an exemplary embodiment, a Cation Exchange Membrane (CEM) cathode can be used to improve the transmittance of the first display region 100, which is convenient for providing a sensor in the first display region 100.

In an exemplary embodiment, the passive light-emitting device is, for example, a passive matrix organic light-emitting diode (PMOLED), and the active light-emitting device is, for example, an active matrix organic light-emitting diode (AMOLED), but embodiments of the present disclosure are not limited thereto.

In an exemplary embodiment, the first display region 100 may be disposed at the edge of the shorter side of the second display region 200. However, it is not limited to here, and may be disposed at other positions as required.

In an exemplary embodiment, the shape of the first display region 100 includes, for example, a rectangle, and the length of the first display region 100 along the first direction X in FIG. 2 is longer, which is convenient for providing sensors and the like. The shape of the first display region 100 is only an example, and can be designed to be other shapes as required. The first direction X is, for example, the extending direction of the first pixel row, and the second direction Y is, for example, the extending direction of the first pixel column, which may be perpendicular to the first direction, and the first pixel row includes a row of first pixels 101.

In an exemplary embodiment, a plurality of first display regions 100 may be provided in the display substrate.

In an exemplary embodiment, the first pixel 101 and the second pixel 201 are distributed in an array, for example.

In an exemplary embodiment, as shown in FIG. 2, the first pixel 101 may include a first color sub-pixel 1011, a second color sub-pixel 1012 and a third color sub-pixel 1013, which are respectively provided with the passive light-emitting devices. The passive light-emitting device in the first color sub-pixel 1011 is configured to emit light of a first color, the passive light-emitting device in the second color sub-pixel 1012 is configured to emit light of a second color, and the passive light-emitting device in the third color sub-pixel 1013 is configured to emit light of a third color. In some examples, the first color, the second color and the third color may be selected from red, green and blue. For example, the first color is blue, the second color is red, and the third color is green. Of course, embodiments of the present disclosure include but are not limited to this. The first color, the second color and the third color can also be other colors.

In an exemplary embodiment, the pixel drive circuit may include a storage capacitor and a transistor electrically connected to the storage capacitor. For example, the pixel circuit may include at least one of a 2T1C pixel circuit, a 3T1C pixel circuit and a 7T1C pixel circuit.

In an exemplary embodiment, the first display region 100 further includes a plurality of first driving signal wire groups 60 and a plurality of second driving signal wires, each first driving signal wire group 60 corresponds to a first pixel row, and the first driving signal wire is connected to the anode of the passive light-emitting device of the corresponding row of first pixels, and one first driving signal wire group includes a plurality of first driving signal wires. The anode of the passive light-emitting device in the same color sub-pixel of the first pixel 101 in the same row may be electrically connected to one of the first driving signal wires. For example, a plurality of first driving signal wires in a first driving signal wire group are respectively a first sub-driving signal wire, a second sub-driving signal wire and a third sub-driving signal wire. The first sub-driving signal wire connects the anode of the first color sub-pixel 1011 of the corresponding first pixel 101 (that is, the first pixel in the first pixel row corresponding to the first driving signal wire group to which the first sub-driving signal wire belongs), the second sub-driving signal wire connects the anode of the second color sub-pixel 1012 of the corresponding first pixel 101, and the third sub-driving signal wire connects the anode of the third color sub-pixel 1013 of the corresponding first pixel 101. A cathode of the passive light-emitting device of the first pixels 101 in a same column may be electrically connected to one second driving signal wire, Or, a cathode of the passive light-emitting device may be electrically connected to one first driving signal wire. The cathode of the passive light-emitting device in the same color sub-pixel of the first pixel 101 in the same row may be electrically connected to one of the first driving signal wires. An anode of the passive light-emitting device of the first pixels 101 in a same column is electrically connected to one second driving signal wire.

Figure 3:
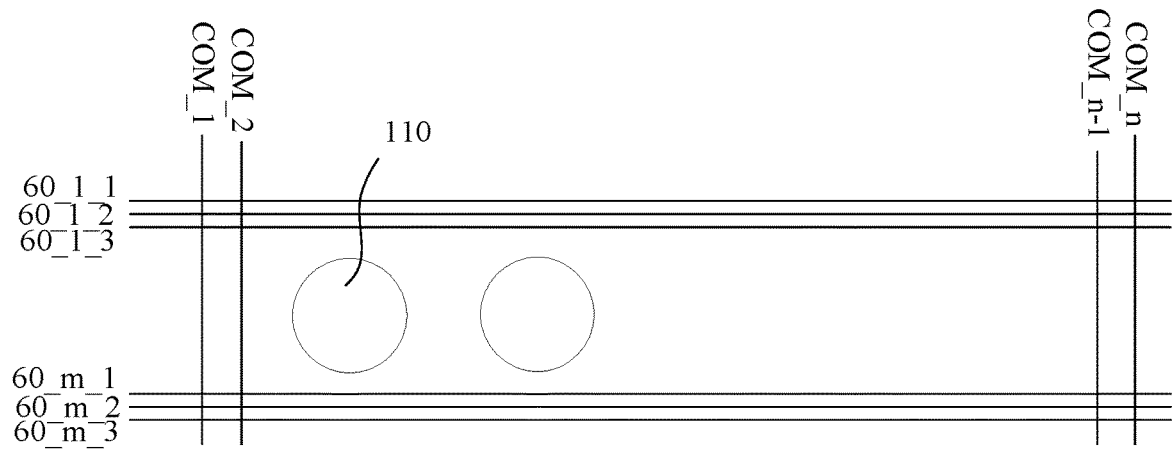
FIG. 3 is a schematic diagram of a driving signal wire according to an exemplary embodiment.

As shown in FIG. 3, the first display region 100 includes n columns of first pixels 101, m rows of first pixels 101, a plurality of first driving signal wire groups 60_j, where j=1 to m, and a plurality of second driving signal wires COM_1 to COM_n; wherein, the cathode of the passive light-emitting device of the i-th column of the first pixels 101 is connected to the i-th second driving signal wire COM_i, where i=1 to n. The first driving signal wire group 60_j includes a plurality of first driving signal wires 60_j_1, 60_j_2 and 60_j_3. The first color sub-pixel 1011 of the first pixel 101 in the j-th row is connected to the first driving signal wire 60_j_1, the second color sub-pixel 1012 of the first pixel 101 in the j-th row is connected to the first driving signal wire 60_j_2, and the third color sub-pixel 1013 of the first pixel 101 in the j-th row is connected to the first driving signal wire 60_j_3. In the present embodiment, the driving mode of the first display region 100 is as follows: the first pixel column 103 is scanned column by column. When the i-th column is scanned, the i-th second driving signal wire COM_i is set to a low level (for example, 0 volts (V), but is not limited here), and the rest of the second driving signal wires (n−1 second driving signal wires except COM_i) are set to a high level (so that the first pixel 101 in the other columns outside the i-th column does not emit light). The signals provided by the first driving signal wires 60_j_1, 60_j_2, 60_j_3, where j=1 to m, control the brightness of a plurality of sub-pixels in the i-th column. In the present embodiment, the quantity of first driving signal wires included in a first driving signal wire group is only an example. If the first pixel 101 includes other quantity of sub-pixels, e.g., four, the quantity of first driving signal wires included in the first driving signal wire group can be changed accordingly. The first display region 100 may further include an anti-diffraction region 110, and the anti-diffraction region 110 may be provided with a sensor device, such as a camera. The first display region 100 may include one or more anti-diffraction regions 110. In another embodiment, the anti-diffraction region 110 may be the same as the first display region 100.

Figure 4:
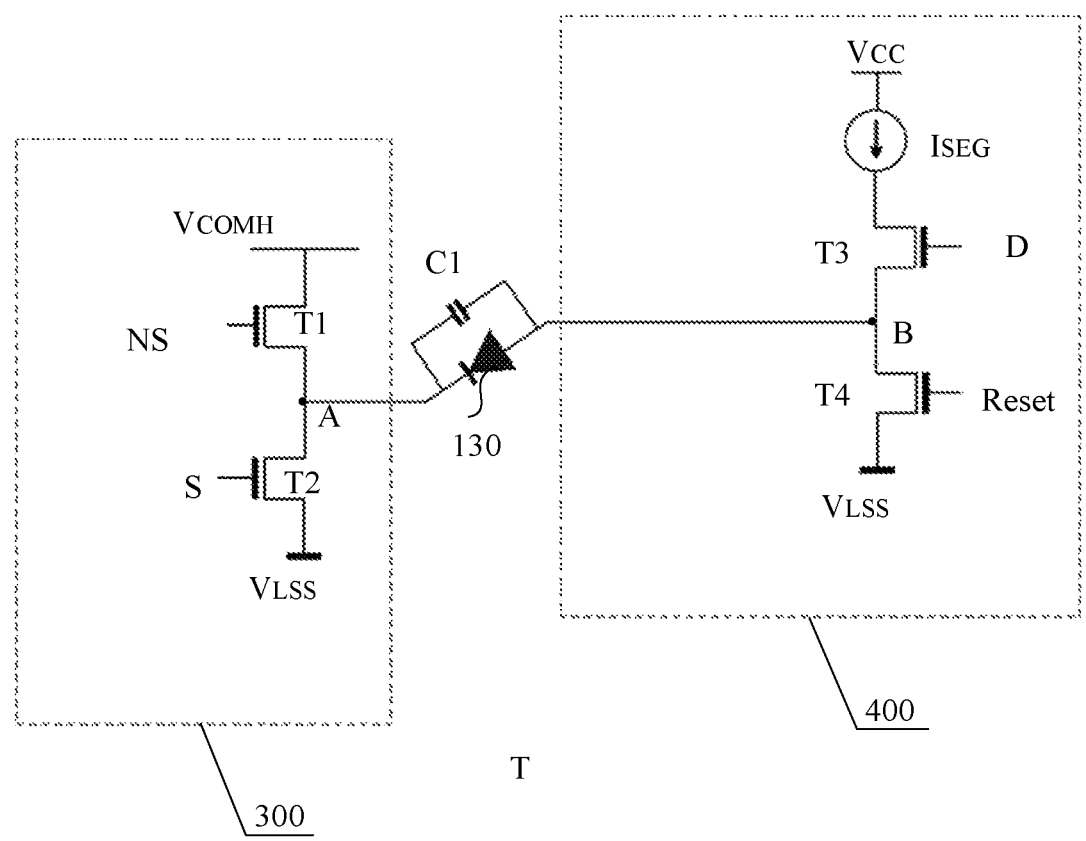
FIG. 4 is a schematic diagram of driving a passive light-emitting device according to an exemplary embodiment.

FIG. 4 is a circuit connection diagram of a passive light-emitting device provided by an exemplary embodiment. As shown in FIG. 4, in the present embodiment, a capacitor C1 is connected in parallel at both terminals of the passive light-emitting device 130. The cathode of the passive light-emitting device 130 is connected to the output terminal A of the first driver 300 through the second driving signal wire, and the anode of the passive light-emitting device 130 is connected to the output terminal B of the second driver 400 through the first driving signal wire. The first driver 300 may include a first transistor T1 and a second transistor T2. The first transistor T1 has a control electrode connected to a first control terminal NS, a first electrode connected to a first power supply terminal VCOMH, and a second electrode connected to the first terminal of the second transistor T2 and the output terminal A. The first electrode of the second transistor T2 is connected to the second control terminal S, and the second electrode is connected to the second power terminal VLSS. When the first transistor T1 is powered on and the second transistor T2 is powered off, the first driver 300 outputs the voltage (high level) of the first power supply terminal $V_{COMH}$ and the passive light-emitting device 130 does not emit light. When the first transistor T1 is powered off and the second transistor T2 is powered on, the first driver 300 outputs the voltage (low level) of the second power supply terminal $V_{LSS}$ and the passive light-emitting device 130 emits light. The second driver 400 includes a current source Isec, a third transistor T3 and a fourth transistor T4. One terminal of the current source is connected to a third power supply terminal Vcc, and the other terminal is connected to the first electrode of third transistor T3. The control electrode of third transistor T3 is connected to control terminal D, and the second electrode is connected to output terminal B. The first electrode of the fourth transistor T4 is connected to the output terminal B, the second electrode is connected to the second power supply terminal $V_{LSS}$, and the control electrode is connected to a reset terminal (Reset). When the third transistor T3 is powered on and the fourth transistor T4 is powered off, and the cathode of the passive light-emitting device 130 is connected to a low level, the passive light-emitting device 130 emits light, and the current of the current source Isec controls the brightness of the passive light-emitting device 130. When the third transistor T3 and the fourth transistor T4 are powered on, the passive light-emitting device 130 does not emit light.

Figure 5:
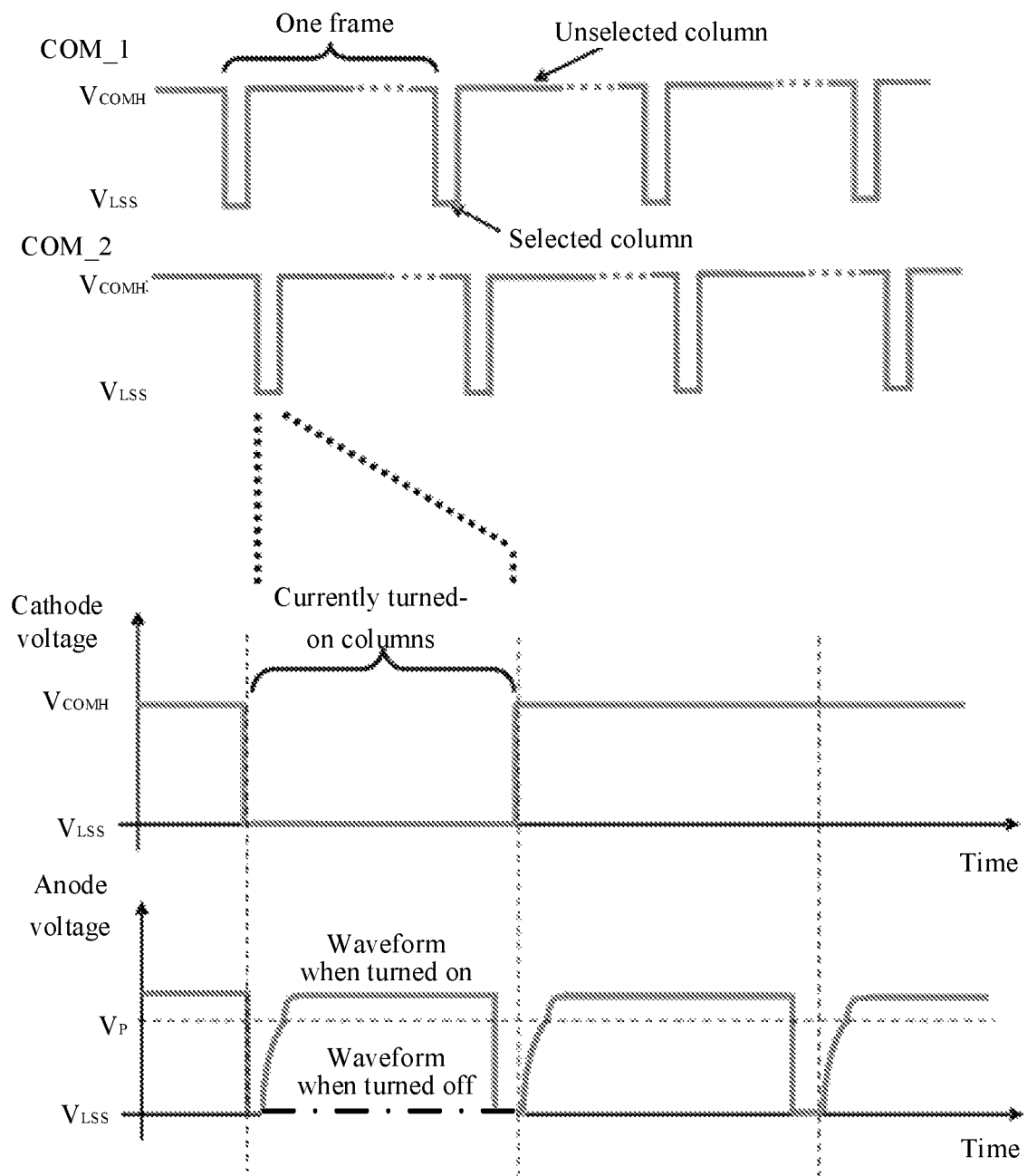
FIG. 5 is a schematic diagram of driving a first display region according to an exemplary embodiment.

FIG. 5 is a schematic diagram of driving a first display region according to an exemplary embodiment. As shown in FIG. 5, in one frame scanning time, the second driving signal wires COM_1 to COM_n are sequentially applied with low-level signals (only COM_1 and COM_2 are illustrated in FIG. 5, while others are similar), so that the low-level is applied to the cathode of the passive light-emitting device of the first pixel column connected to the second driving signal wire, and the first pixel 101 of the first column to the first pixel 101 of the n-th column are sequentially powered on, and the first driving signal wire applies the driving signal to the anode of the passive light-emitting device to enable the passive light-emitting device to emit light.

Figure 6:
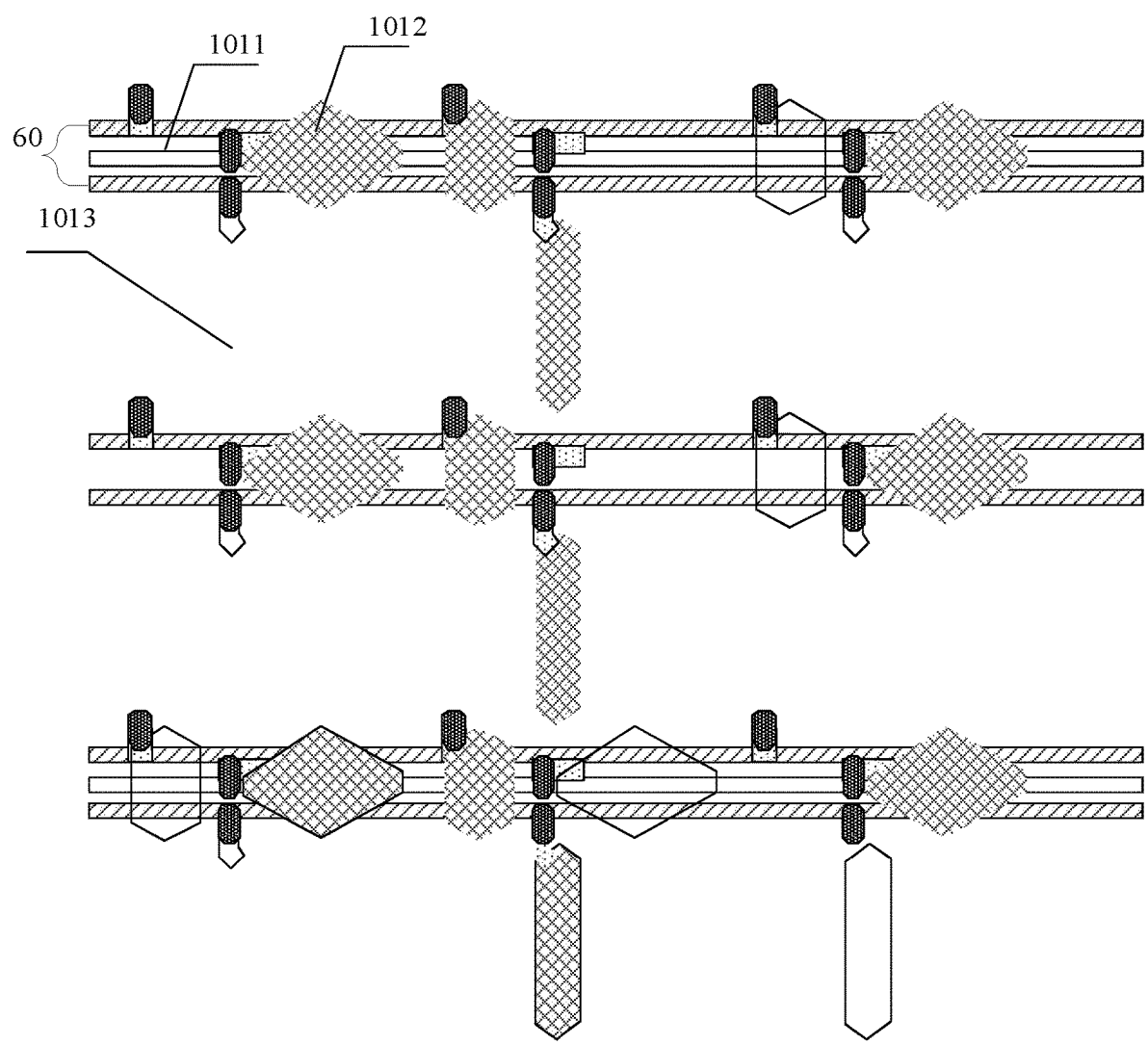
FIG. 6 is a schematic diagram of the layout of a first driving signal wire group according to an exemplary embodiment.

In an exemplary embodiment, as shown in FIG. 6, in the first display region 100, each row of first pixels 101 corresponds to a first driving signal wire group 60_j, which includes a plurality of first driving signal wires. In the present embodiment, the first driving signal wires may extend along the extending direction of the first pixel row and penetrate through the first display region 100. Because of the first driving signal wire, the light forms a complex diffraction intensity distribution and diffraction stripes then occur when the light passing through the edge of the first driving signal wire. Strong diffraction will occur when a camera is placed under the screen and pictures are taken, resulting in poor imaging effect. In the embodiment of the present disclosure, an anti-diffraction structure is provided in the anti-diffraction region 110, and the anti-diffraction structure is configured to reduce the diffraction intensity of the first driving signal wire group 60. The anti-diffraction structure can be achieved in various ways. In an exemplary embodiment, the anti-diffraction structure may include a plurality of shield parts, which shield the first driving signal wire group from the light respectively, thereby reducing diffraction intensity. Or, the anti-diffraction structure may include the first driving signal wire group 60, and the shape of the cross-sectional parallel to the substrate of the first driving signal wire of the anti-diffraction region 110 is adjusted to be a sinusoidal curve, so that light rays are diffused in a plurality of directions when passing through the edge of the first driving signal wire, improving the diffraction effect.

Figure 7:
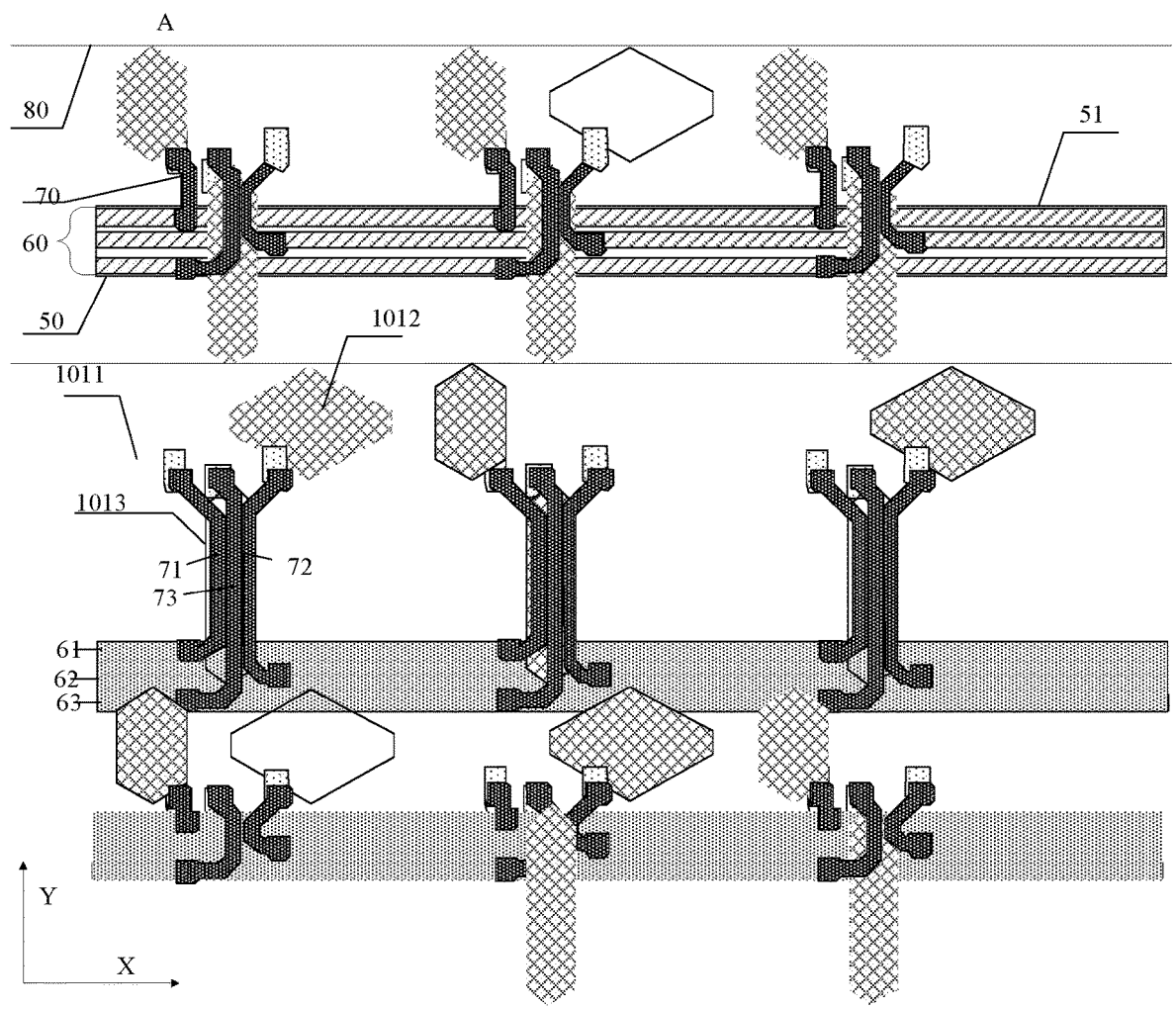
FIG. 7 is a schematic diagram of an anti-diffraction structure according to an exemplary embodiment.

FIG. 7 is a schematic diagram of an anti-diffraction structure according to an exemplary embodiment. As shown in FIG. 7, the anti-diffraction structure provided in the present embodiment may include a plurality of shield parts 50, which correspond to the first driving signal wire group 60 one by one. The shield parts 50 are located on one side of the first driving signal wire group 60 close to the substrate. On a direction parallel to the substrate, in the anti-diffraction region 110, an orthographic projection of the first driving signal wire of the first driving signal wire group 60 is located in an orthographic projection of the corresponding shield part 50. That is, in the anti-diffraction region 110, the shield part 50 shields the first driving signal wires of the corresponding first driving signal wire group, and may shield part or all of the first driving signal wires. In an exemplary embodiment, on a direction parallel to the substrate, in the anti-diffraction region 110, an orthographic projection of the first driving signal wire group 60 is the same as or slightly smaller than an orthographic projection of the corresponding shield part 50. According to the solution provided in the present embodiment, the diffraction caused by the first driving signal wire is reduced by shielding the first driving signal wire.

In an exemplary embodiment, the anti-diffraction region 110 may be the entire first display region 100, or may be a photosensitive region of a camera. When the anti-diffraction region 110 is the photosensitive region of the camera, the shield part 50 may not be provided in the region outside the anti-diffraction region 110 in the first display region 100, or the shield part 50 may be provided in the region outside the anti-diffraction region 110 in the first display region 100.

In an exemplary embodiment, the shielding portion 50 may be made of metals, such as silver Ag, copper Cu, aluminum Al, molybdenum Mo, etc., or alloy materials of the aforementioned metals, such as aluminum neodymium alloy AlNd, molybdenum-niobium alloy MoNb, etc..

In an exemplary embodiment, as shown in FIG. 7, the anti-diffraction region 110 includes N shield parts 50. On a plane direction to the substrate, the position of an orthographic projection of the shield part 50 circulates, with K as a cycle, in the region formed by an orthographic projection of the corresponding first pixel row, and the distance between the shield part 50 and the reference line 80 of the corresponding first pixel row may be used to describe the position of the shield part 50 in the region formed by the orthographic projection of the first pixel row. The reference line 80 of the first pixel row is parallel to a first direction X and includes the boundary point of the pixel opening region of the first pixel row closest to a first side A of the first display region 100. The pixel opening region refers to the opening on the pixel define layer, and the light-emitting layer of the sub-pixel is disposed in the pixel opening region. On a direction parallel to the substrate, the distance between an orthographic projection of the shield part 50 and an orthographic projection of the reference line 80 of the first pixel row refers to the distance between an orthographic projection of the first boundary of the shield part 50 close to the first side A and an orthographic projection of the reference line 80 of the corresponding first pixel row (if the first boundary is a curve, the distance can be calculated after converting the first boundary into a straight line boundary, for example, the boundary of a quadrilateral region containing the shield part and having the smallest orthographic projection is taken as the first boundary of the shield part). On that assumption that the i-th shield part correspond to the i-th first pixel row (i. e. the first pixel in the i-th row), the i-th distance between a first boundary of an orthographic projection of the i-th shield part and an orthographic projection of a reference line of the i-th first pixel row is the same as the (K+i)-th distance between the first boundary of an orthographic projection of the (K+i)-th shield part and an orthographic projection of a reference line of the first pixel row corresponding to the (K+i)-th shield part. The distances between the first boundary of an orthographic projection of the consecutive K shield parts and an orthographic projection of the reference line of the first pixel row corresponding to the shield parts are different from each other, (that is, the distances between the orthographic projections of different shield parts in a same cycle period and the orthographic projection of the reference line corresponding to the first pixel row are different), wherein K is a preset value, i is 1 to N-K, and K is less than N; Taking N as 16 and K as 8 as examples, the first to eighth distances are the same as the ninth to sixteenth distances, that is, the first distance and the ninth distance are the same, the second distance and tenth distance are the same, and so on, and the eighth distance is the same as the sixteenth distance. In addition, the first, second, third, fourth, fifth, sixth, seventh and eighth distances are all different. When N is 20 and K is 8, the eleventh distance and sixteenth distance are similar to the previous embodiment, the seventeenth distance is the same as the first distance, the eighteenth distance is the same as the second distance, the nineteenth distance is the same as the third distance, and the twentieth distance is the same as the fourth distance. In the present embodiment, by introducing a layout mode in which the position of the shield part changes periodically and the positions of different shield parts are different in the cycle, the intensity of diffraction in a certain fixed direction may be weakened in comparison to a layout mode in which the position of the shield part is fixed, and the brightness ripples generated by diffraction may be dispersed, thereby improving the overall imaging effect.

In an exemplary embodiment, the K is greater than or equal to 8.

In an exemplary embodiment, on a direction parallel to the substrate, the cross-sectional shape of the shield part 50 includes a quadrangle, and there are two opposite boundaries parallel to the reference line 80. In an exemplary embodiment, when K=8 and the size of an orthographic projection of the first pixel 101 on a plane parallel to the substrate is 127 um*127 um (the first display region may be evenly divided into a plurality of pixel regions, each pixel region includes a first pixel, and the size of the pixel region is the size of the first pixel 101), the distances between the first boundary of the first shield part 50 to the eighth shield part 50 and the orthographic projection of the corresponding reference lines of are shown in Table 1.

TABLE 1

Distance between an Orthographic Projection of the Shield Part and an Orthographic Projection of the Reference Line (On a Plane Parallel to the Substrate)

| Shield part | 1 | 2 | 3 | 4 | 5 | 6 | 7 | 8 |
|---|---|---|---|---|---|---|---|---|
| Distance between shield part and reference line (um) | 107 | 117 | 90 | 118 | 75 | 118 | 59 | 91 |

Figure 8:
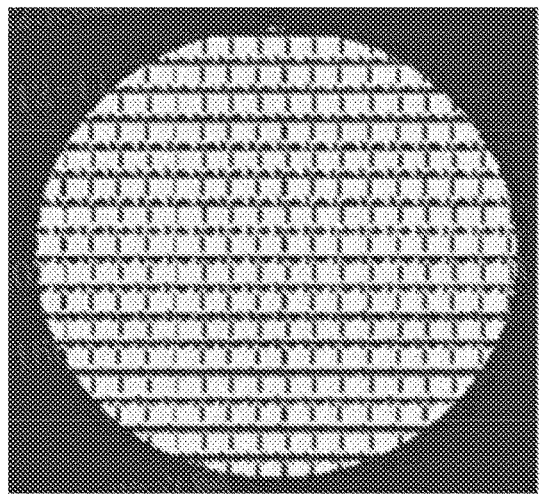
FIG. 8 is a schematic diagram of layouts of the anti-diffraction region in the solution 1 and the solution 2 according to an embodiment.
Figure 8:
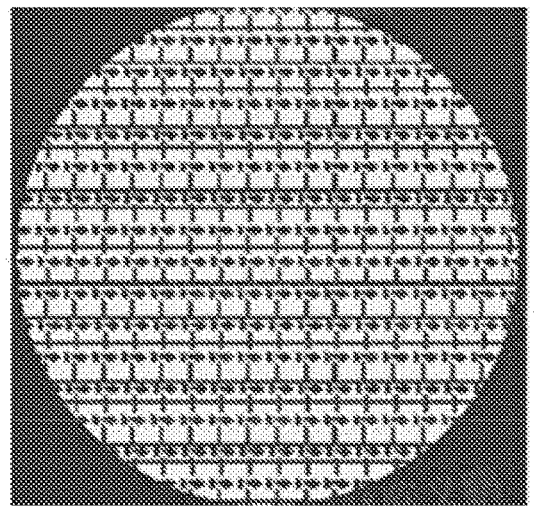
Figure 9:
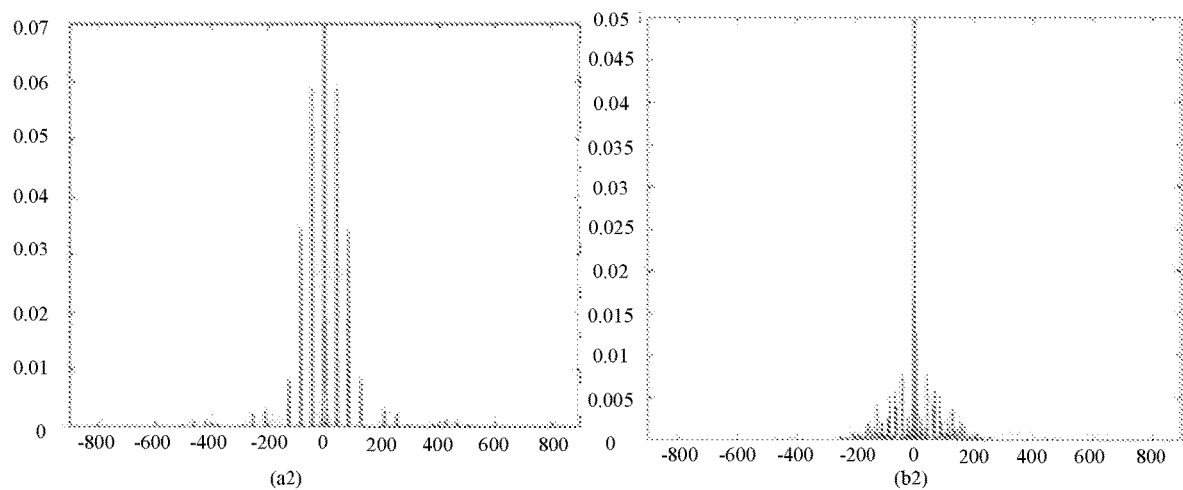
FIG. 9 is a schematic diagram of diffraction intensities in solution 1 and solution 2 according to an embodiment.

With the solution of the present embodiment, compared with the solution that the distance between the shield part 50 and the reference line of the corresponding first pixel row is fixed (solution 1), the diffraction intensity from 0 to 0.5 degrees may be reduced to ⅓ of the original diffraction intensity. FIG. (a1) in FIG. 8 is a schematic diagram of the anti-diffraction region of solution 1, and FIG. (b1) in FIG. 8 is a schematic diagram of the anti-diffraction region of solution 2 (the position of the shield part 50 is shown in Table 1). The diffraction intensities of the two solutions are shown in FIG. 9, in which FIG. (a2) is a schematic diagram of the diffraction intensity of solution 1 and FIG. (b2) is a schematic diagram of the diffraction intensity of solution 2, in which abscissa is a diffraction order and ordinate is the diffraction intensity. As shown in FIGS. 9($a2$) and 9($b2$), after changing the distance between the shield part 50 and the reference line of the corresponding first pixel row, the diffraction intensity is greatly reduced. As shown in Table 2, it can be seen that the diffraction intensity from 0 degree to 0.5 degree in solution 1 is 5.890%, and that from 0 degree to 0.5 degree in solution 2 is 1.465%, which is 29.3% of that in solution I, which greatly reduces the diffraction intensity from 0 degree to 0.5 degree.

TABLE 2

Diffraction Intensity of Solution 1 and Solution 2

| Diffraction Angle | 0 to 0.5° | 0.5 to 1° | 1 to 1.5° |
|---|---|---|---|
| Solution 1 | 5.890% | 0.850% | 0.300% |
| Solution 2 | 1.465% | 0.820% | 0.400% |

The above description of the position of the shield part 50 using a reference line is only an example, and other reference lines may be used for description.

In an exemplary embodiment, when K=8, on a plane parallel to the substrate, the distance between the first boundary of an orthographic projection of the first shield part and an orthographic projection of the reference line of the first pixel row corresponding to the first shield part is 107/127±10% reference units;

the distance between the first boundary of an orthographic projection of the second shield part and an orthographic projection of the reference line of the first pixel row corresponding to the second shield part is 117/127±10% reference units;

the distance between the first boundary of an orthographic projection of the third shield part and an orthographic projection of the reference line of the first pixel row corresponding to the third shield part is 90/127±10% reference units;

the distance between the first boundary of an orthographic projection of the fourth shield part and an orthographic projection of the reference line of the first pixel row corresponding to the fourth shield part is 118/127±10% reference units;

the distance between the first boundary of an orthographic projection of the fifth shield part and an orthographic projection of the reference line of the first pixel row corresponding to the fifth shield part is 75/127±10% reference units;

the distance between the first boundary of an orthographic projection of the sixth shield part and an orthographic projection of the reference line of the first pixel row corresponding to the sixth shield part is 118/127±10% reference units;

the distance between the first boundary of an orthographic projection of the seventh shield part and an orthographic projection of the reference line of the first pixel row corresponding to the seventh shield part is 59/127±10% reference units;

the distance between the first boundary of an orthographic projection of the eighth shield part and an orthographic projection of the reference line of the first pixel row corresponding to the eighth shield part is 91/127±10% reference units; and the reference unit is determined according to the size of an orthographic projection of the first pixel parallel to the substrate. For example, the size of the first pixel is 127 um*127 um, and the reference unit may be the side length of the first pixel 127 um.

In an exemplary embodiment, the pixel drive circuit includes a gate electrode, a first capacitor electrode, a second capacitor electrode, a source electrode and a drain electrode, wherein the first capacitor electrode and the second capacitor electrode form a storage capacitor, the first driving signal wire may be disposed in the same layer as the source electrode and the drain electrode, and the shield part 50 may be disposed in the same layer as the second capacitor electrode. That is, the shield part 50 and the second capacitor electrode may be formed by one preparation process. The shield part 50 may be made of the same material as the second capacitor electrode. The shield part 50 and the second capacitor electrode are disposed on the same layer, which can avoid increasing the operation process and reduce the cost. In another embodiment, the shield part 50 may be disposed on other layers, for example, on the same layer as a gate electrode, and the shield part 50 may be as close to the first driving signal wire as possible to improve the shielding effect. In another embodiment, the first driving signal wire may be disposed in the same layer as the second capacitor electrode. The embodiments of the present disclosure are not limited here.

In an exemplary embodiment, on a direction parallel to the substrate, the cross-sectional shape of the shield part 50 is not limited to quadrangles, but may be other shapes, such as hexagons, and so on.

In an exemplary embodiment, the edge of the shield part 50 may be curved, which can reduce the diffraction intensity.

In an exemplary embodiment, the first driving signal wire group 60 further includes a connecting lead connecting the first driving signal wire and the anode of the passive light-emitting device through a via.

In an exemplary embodiment, as shown in FIG. 7, the first color sub-pixel 1011 and the second color sub-pixel 1012 are disposed in the same row, and the third color sub-pixel 1013 is located in a row adjacent to the row where the first color sub-pixel 1011 and the second color sub-pixel 1012 are located; the row where the first color sub-pixel 1011 is located and the row where the third color sub-pixel 1013 is located are alternately disposed in the first display region 100.

The first driving signal wire is connected to the anode of the corresponding sub-pixel through a connecting lead 70. For example, the first driving signal wire 61 is connected to the anode of the first color sub-pixel 1011 through the connecting lead 71, the first driving signal wire 62 is connected to the second color sub-pixel 1012 through the connecting lead 72, and the first driving signal wire 63 is connected to the third color sub-pixel 1013 through the connecting lead 73.

On a direction parallel to the substrate, in a same first pixel 101, when the shortest distance between the first driving signal wire and the pixel opening region of the passive light-emitting device of the first pixel 101 is larger than a preset distance, an orthographic projection of the connecting lead 70 connected by the first driving signal wire is overlapped with an orthographic projection of the pixel opening region of the third color sub-pixel 1013 of the first pixel 101. The default distance may be set as required. The pixel opening region refers to the opening on the pixel define layer, and the light-emitting layer of each sub-pixel of the passive light-emitting device is disposed in the pixel opening region. In the solution provided in the present embodiment, the connecting lead 70 is overlapped with the pixel opening region of the third color sub-pixel 1013 as much as possible, which can improve the transmittance.

Figure 10:
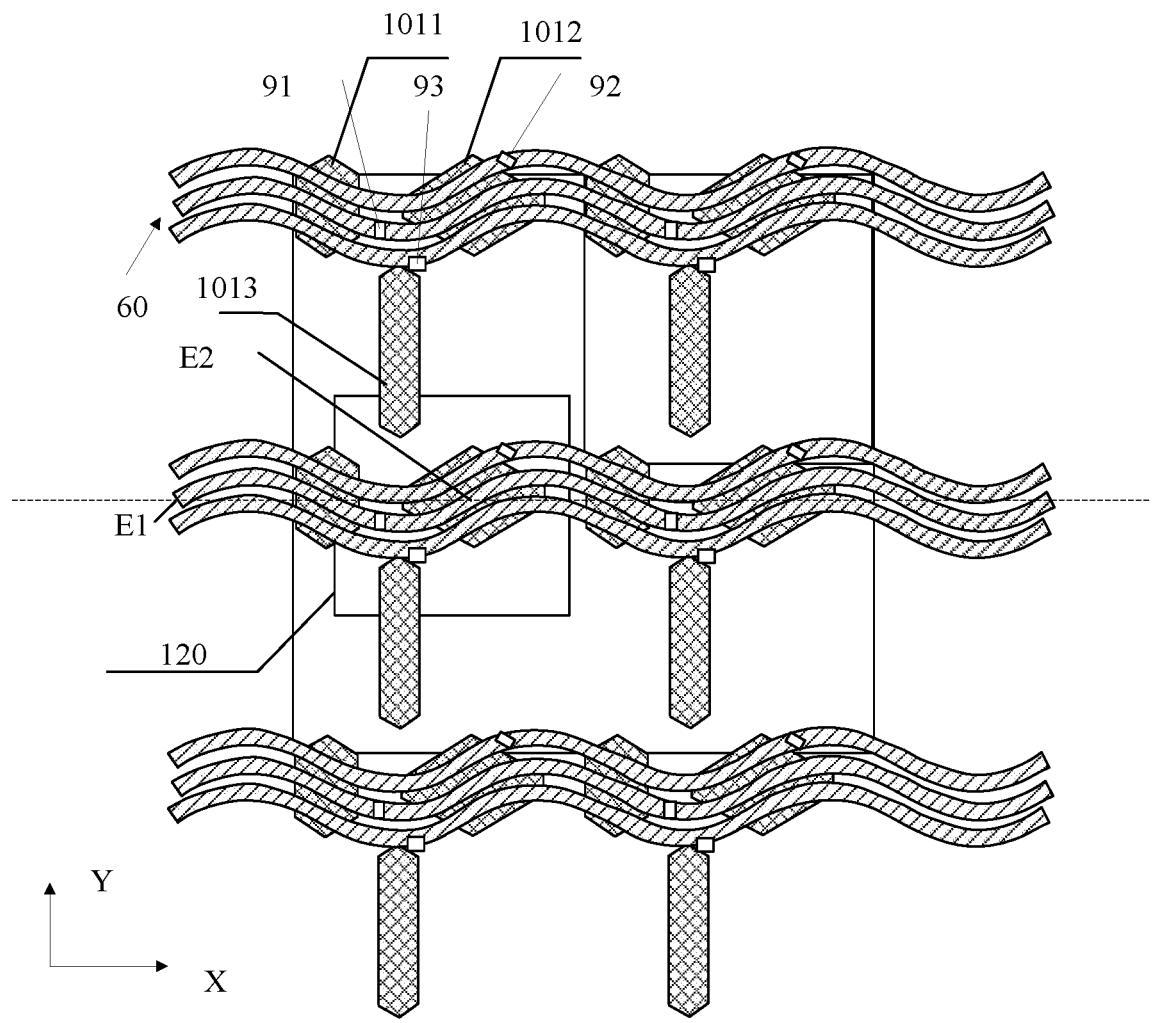
FIG. 10 is a schematic diagram of an anti-diffraction structure according to another embodiment.
Figure 11:
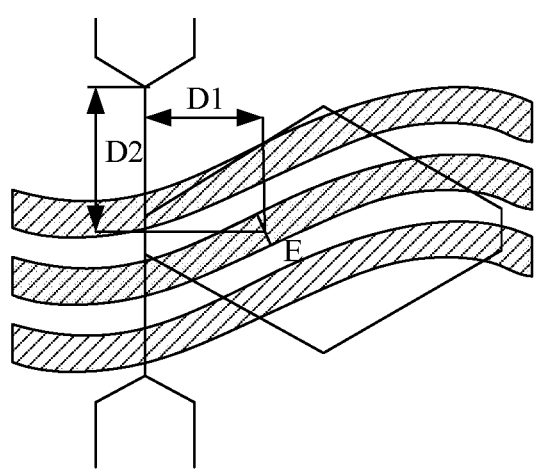
FIG. 11 is a locally enlarged diagram of FIG. 10.

FIG. 10 is a schematic diagram of an anti-diffraction structure according to an embodiment, and FIG. 11 is an enlarged view of region 120 in FIG. 10. As shown in FIG. 10, in the present embodiment, the anti-diffraction structure includes the first driving signal wire group 60, and on a direction parallel to the base of the display substrate, the cross-sectional shape of the first driving signal wire in the anti-diffraction region 110 includes a sinusoidal curve. The anodes of the first color sub-pixel 1011, the second color sub-pixel 1012 and the third color sub-pixel 1013 are respectively connected to one driving signal wire in the first driving signal wire group 60 through a via at position 91, a via at position 92 and a via at position 93. The positions 91, 92 and 93 may be set as required, for example, as close to the anode to be connected as possible. According to the solution provided in the present embodiment, the first driving signal wire is designed in a sinusoidal shape, and light rays are diffused in a plurality of directions when passing through the edge of the first driving signal wire, thereby improving the diffraction effect and reducing the diffraction intensity. According to the solution provided by the present embodiment, the process is barely changed, hence the implementation is convenient.

In an exemplary embodiment, on a direction parallel to the substrate, the cross-section of the first driving signal wire outside the anti-diffraction region 110 may be a sinusoidal curve (the extending direction is a sinusoidal curve), or may be straight (the extending direction is straight).

In an exemplary embodiment, in a same first driving signal wire group 60, the first driving signal wires are parallel to each other, the distances between adjacent first driving signal wires are the same, and the widths of the first driving signal wires are the same.

In an exemplary embodiment, the distance between the starting point E1 and the ending point E2 of the sinusoidal curve formed by the first driving signal wire in one cycle may be 0.9 to 1.1 reference units, and the amplitude of the sinusoidal curve formed by the first driving signal wire may be 10/127±10% reference units. For example, when an orthographic projection of the first pixel 101 is 127 um*127 um, the distance between the starting point E1 and the ending point E2 in a cycle of the sinusoidal curve formed by the first driving signal wire may be 127 um, and the amplitude may be 10 um.

In an exemplary embodiment, the widths of the first driving signal wire may be 6.2/127±10% reference units.

In an exemplary embodiment, the distance of the adjacent first driving signal wire may be 5.8/127±10% reference units.

As shown in FIG. 11, the line connecting the two closest points between the anodes of the two third color sub-pixels 1013 in the same column adjacent to the first driving signal wire is taken as the vertical axis of the reference coordinate system, a straight line perpendicular to the aforementioned line and passing through the midpoint of the aforementioned line is taken as the horizontal axis, and the midpoint is taken as the center point of the reference coordinate system, the coordinates of the starting point E of one cycle of the sinusoidal curve formed by the first driving signal wire are (D1, 0), where, the connection length of the two closet points between the anodes of two third color sub-pixels 1013 in the same column is 2*D2. When the size of the first pixel is 127 um*127 um, D1=21.2 um and D2=25.53 um. However, the position of the first driving signal wire is not limited here, and the first driving signal wire may be translated along the first direction X.

In an exemplary embodiment, the first pixel includes a first color sub-pixel, a second color sub-pixel and a third color sub-pixel; the first color sub-pixel and the second color sub-pixel are disposed in the same row, and the third color sub-pixel is located in a row adjacent to the row where the first color sub-pixel and the second color sub-pixel are located; and, the row where the first color sub-pixel is located and the row where the third color sub-pixel is located are alternately disposed in the first display region.

In an exemplary embodiment, on a plane parallel to the substrate, an orthographic projection of the first driving signal wire group may be overlapped with an orthographic projection of the pixel opening region of the first color sub-pixel 1011 and an orthographic projection of the pixel opening region of the second color sub-pixel 1012 of the corresponding first pixel row, and is located outside an orthographic projection of the pixel opening region of the third color sub-pixel 1013. In the solution provided in the present embodiment, the first driving signal wire is disposed in the same row as the first color sub-pixel 1011 and the second color sub-pixel 1012, which can improve the transmittance, but the embodiment of the present disclosure is not limited here and may be disposed at other positions.

In an exemplary embodiment, the pixel drive circuit includes a gate electrode, a first capacitor electrode, a second capacitor electrode, a source electrode and a drain electrode, wherein the first capacitor electrode and the second capacitor electrode form a storage capacitor, the first driving signal wire may be disposed in the same layer as the gate electrode, or be disposed in the same layer as the source electrode or the drain electrode, or may be disposed in the same layer as the second capacitor electrode. The embodiments of the present disclosure are not limited here.

In an exemplary embodiment, when an orthographic projection of the first pixel 101 is 127 um*127 um, the distance between the starting point E1 and the ending point E2 of the sinusoidal curve in a cycle formed by the first driving signal wire may be 127 um, and the amplitude may be 10 um. The widths of the first driving signal wire may be 6.2 um, and the distance between adjacent first driving signal wires may be 5.8 um. The comparison of the diffraction intensity between this solution (referred to as solution 4) and the solution shown in FIG. 6 (referred to as solution 3) is shown in Table 3. It can be seen that the diffraction intensity of solution 4 may be mostly concentrated in the range of 0 to 0.5 degrees, and the diffraction intensity with large angle of 0.5 to 10 degrees is greatly reduced, in particular, the diffraction intensity of 1 to 10 degrees is greatly reduced. In addition, compared with solution 3, the diffraction intensity of 0 to 0.5 degrees is also improved, which is reduced from 8.34% of solution 3 to 5.890% of solution 1.

TABLE 3

Diffraction Intensity and Transmittance of Solution 3 and Solution 4

| | Diffraction Angle | | | | | |
|---|---|---|---|---|---|---|
| | 0 to 0.5° | 0.5 to 1° | 1 to 2° | 2 to 5° | 5 to 10° | Trans (Transmittance) |
| Solution 3 | 8.34% | 0.61% | 0.28% | 0.17% | 0.016% | 18.19% |
| Solution 4 | 8.95% | 0.62% | 0.096% | 0.090% | 0.0089% | 17.86% |

A structure of a display substrate according to the present embodiments is described below with a preparation process of a display substrate. Wherein, the "patterning process" mentioned in the present disclosure includes processes, such as film layer deposition, photoresist coating, mask exposure, development, etching, and photoresist stripping. The deposition may be selected as any one or more of sputtering, evaporation and chemical vapor deposition, the coating may be selected as any one or more of spraying and spin coating, and etching may be selected as any one or more of dry etching and wet etching. A "thin film" refers to a layer of thin film manufactured by deposition or coating of a certain material on a substrate. If the "thin film" does not need a patterning process during the whole manufacturing process, the "thin film" may also be called a "layer". When the "thin film" needs to be subjected to a patterning process during the whole manufacturing process, a "thin film" is referred to as a "thin film" prior to the patterning process and as a "layer" subsequent to the patterning process. The "layer" subsequent to the patterning process contains at least one "pattern". In the present disclosure, "a and b are disposed on the same layer" means that a and b are formed at the same time by the same patterning process.

The preparation process of the display substrate provided with a shield part may include the following operation procedures:

(1) A flexible material is coated on a glass carrier plate 1, and is cured to form a thin film to form the substrate 10. In the present embodiment, the substrate 10 may be a flexible substrate. The flexible material may be polyimide (PI), polyethylene terephthalate (PET) or a surface-treated polymer soft thin film or the like. In an exemplary implementation, the substrate 10 may have a single-layer structure or a laminated multi-layer structure. The substrate of the laminated structure may include flexible material/inorganic material/flexible material, flexible material/inorganic material/amorphous silicon/flexible material/inorganic material, etc. The inorganic material may be a Barrier thin film, such as silicon nitride (SiNx) or silicon oxide (SiOx), which is used to improve the water and oxygen resistance of the substrate. Taking PI/Barrier/PI/Barrier laminated structure as an example, the preparation process may include: coating a layer of polyimide on a glass carrier plate, curing to be a film and depositing a barrier film, then coating a layer of polyimide on the barrier film, curing to be a film and depositing a barrier film again, thus forming a flexible substrate with laminated structure.

(2) Preparing a pattern of an active layer on the substrate 10.

Sequentially depositing a first insulating thin film and an active layer thin on the substrate 10, and patterning the active layer thin film through a patterning process to form a first insulating layer 11 covering the entire substrate 10 and a pattern of an active layer 12 disposed on the first insulating layer 11. The active layer 12 is formed in the second display region 200. After this patterning process, the first display region 100 includes the first insulating layer 11 disposed on the substrate 10.

(3) Preparing a pattern of a gate electrode.

Sequentially depositing a second insulating thin film and a first metal thin film, and patterning the first metal thin film through a patterning process to form a fourth insulating layer covering the entire substrate 10 and a pattern of the first gate metal layer disposed on the fourth insulating layer. The pattern of the first gate metal layer pattern is formed in the second display region 200 and includes at least a gate electrode 14, a first capacitor electrode 15, a first gate wire (not shown) and a second gate wire (not shown). After this patterning process, the first display region 100 includes the first insulating layer 11 and the second insulating layer 13 stacked on the substrate 10.

(4) Preparing a pattern of a shield part 50.

Sequentially depositing the third insulating thin film and the second metal film, and patterning the second metal thin film through a patterning process to form a second insulating layer 16 covering the entire substrate 10 and a pattern of the second gate metal layer pattern disposed on the second insulating layer 16. The pattern of the second gate metal layer at least includes the second capacitor electrode 17 and the shield part 50, and the position of the second capacitor electrode 17 corresponds to the position of the first capacitor electrode 15. After this patterning process, the first display region 100 includes the first insulating layer 11, the second insulating layer 13, the third insulating layer 16, the shield part 50 stacked on the substrate 10.

(5) Preparing patterns of a source electrode, a drain electrode and a first driving signal wire.

Depositing and patterning a fourth insulating thin film through a patterning process to form a pattern of the fourth insulating layer 18 covering the entire substrate 10, the fourth insulating layer 18 is provided with two vias. The two vias are formed in the second display region 200 at a position corresponding to the position of two terminals of the active layer 12. The fourth insulating layer 18, the third insulating layer 16 and the second insulating layer 13 in the vias are etched away to expose the surface of the active layer 12.

Figure 12:
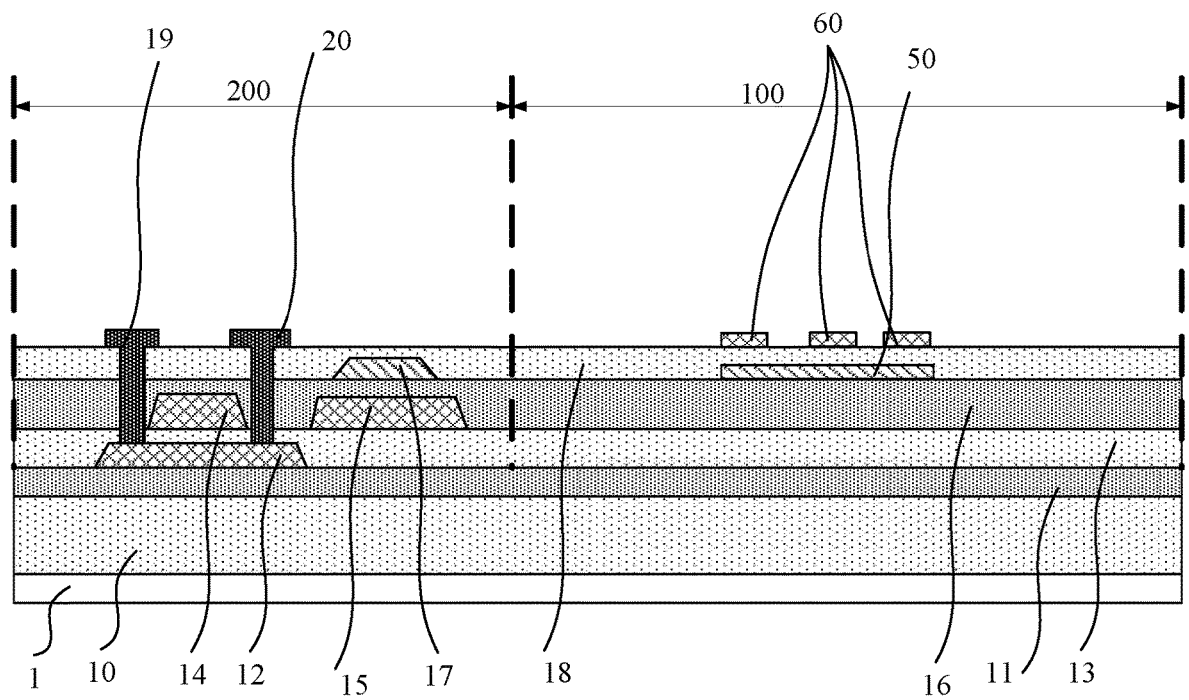
FIG. 12 is a schematic diagram of a display substrate according to an embodiment.

Depositing a third metal film, and patterning the third metal thin film through a patterning process to form a first source-drain metal layer (SD1) on the fourth insulating layer 18, which at least includes a source electrode 19, a drain electrode 20, and first driving signal wires of the first driving signal wire group 60, a data wire (not shown), a power supply line (not shown), etc. The source electrode 19 and the drain electrode 20 are respectively connected to the active layer 12 through the fourth via. As shown in FIG. 12, the active layer 12, the gate electrode 14, the source electrode 19 and the drain electrode 20 form a thin film transistor, and the first capacitor electrode 15 and the second capacitor electrode 17 form a storage capacitor. On a plane parallel to the substrate, the orthographic projection of the first driving signal wires in the first driving signal wire group 60 is located in the shield part 50.

In the present embodiment, the first insulating film, the second insulating film, the third insulating film, and the fourth insulating thin film may be made of at least one of silicon oxide (SiOx), silicon nitride (SiNx), and silicon oxynitride (SiON), and can be a single-layer structure or a multi-layer composite structure. Usually, the first insulating layer 11 is referred to as a buffer layer, which is used to improve the water and oxygen resistance capability of the substrate 10. The second insulating layer 13 and the third insulating layer 16 are referred to as gate insulating (GI) layers. The fourth insulating layer 18 may is referred to as an interlayer insulating (ILD) layer. The first metal thin film, the second metal thin film, and the third metal thin film may be metal materials, such as silver (Ag), copper (Cu), aluminum (Al) and molybdenum (Mo), or alloy materials of the above metals, such as AlNd alloy or MoNb alloy etc., which may have a single-layer structure or a multi-layer composite structure, such as Mo/Cu/Mo. The active layer thin film may be made of amorphous indium gallium zinc oxide (a-IGZO), zinc oxynitride (ZnON), indium zinc tin oxide (IZTO), amorphous silicon (a-Si), polysilicon (p-Si), hexathiophene, polythiophene, etc.

Subsequent preparation of light-emitting structure layer (including anode, pixel define layer, light-emitting layer and cathode) and packaging layer, etc. will not be described in detail. After the subsequent thin film layer preparation is completed, the display substrate is peeled off the glass carrier plate 1 through a peeling process.

The preparation process of the display substrate not provided with a shield part may include the following operation procedures:

(1) A flexible material is coated on a glass carrier plate 1, and is cured to form a thin film to form the substrate 10. In the present embodiment, the substrate 10 may be a flexible base. The flexible material may be polyimide (PI), polyethylene terephthalate (PET) or a surface-treated polymer soft thin film or the like. In an exemplary implementation, the substrate 10 may have a single-layer structure or a laminated multi-layer structure. The substrate of the laminated structure may include flexible material/inorganic material/flexible material, flexible material/inorganic material/amorphous silicon/flexible material/inorganic material, etc. The inorganic material may be a Barrier thin film, such as silicon nitride (SiNx) or silicon oxide (SiOx), which is used to improve the water and oxygen resistance of the substrate. Taking PI/Barrier/PI/Barrier laminated structure as an example, the preparation process may include: coating a layer of polyimide on a glass carrier, curing to a film and depositing a barrier thin film, then coating a layer of polyimide on the barrier thin film, curing to a film and depositing a barrier film again, thus forming a flexible substrate with laminated structure.

(2) Preparing a pattern of an active layer on the substrate 10.

Sequentially depositing a first insulating thin film and an active layer thin on the substrate 10, and patterning the active layer thin film through a patterning process to form a first insulating layer 11 covering the entire substrate 10 and a pattern of an active layer 12 pattern disposed on the first insulating layer 11. The active layer 12 is formed in the second display region 200. After this patterning process, the first display region 100 includes the first insulating layer 11 disposed on the substrate 10.

(3) Preparing patterns of a gate electrode and a first driving signal wire.

Sequentially depositing a second insulating thin film and a first metal thin film, and patterning the first metal thin film through a patterning process to form a second insulating layer 13 covering the entire substrate 10 and a pattern of the first gate metal layer disposed on the second insulating layer 13. The pattern of the first gate metal layer pattern is formed in the second display substrate region 200 and includes at least a gate electrode 14, a first capacitor electrode 15, a first gate wire (not shown) and a second gate wire (not shown). After this patterning process, the first display region 100 includes the first insulating layer 11 and the second insulating layer 13 stacked on the substrate 10.

(4) Preparing a pattern of a second capacitor electrode.

Sequentially depositing the third insulating thin film and the second metal film, and patterning the second metal thin film through a patterning process to form a second insulating layer 16 covering the entire substrate 10 and a pattern of the second gate metal layer pattern disposed on the second insulating layer 16. The pattern of the second gate metal layer at least includes the second capacitor electrode 17, and the position of the second capacitor electrode 17 corresponds to the position of the first capacitor electrode 15. After this patterning process, the first display region 100 includes a first insulating layer 11, a second insulating layer 13, a first driving signal wire group 60, and a third insulating layer 16 stacked on the substrate 10. In another embodiment, the first driving signal wire group 60 may be disposed in the same layer as the second capacitor electrode 17.

(5) Preparing patterns of a source electrode and a drain electrode.

Depositing and patterning a fourth insulating thin film through a patterning process to form a pattern of the fourth insulating layer 18 covering the entire substrate 10, the fourth insulating layer 18 is provided with two vias. The two vias are formed in the second display region 200 at a position corresponding to the position of two terminals of the active layer 12. The fourth insulating layer 18, the third insulating layer 16 and the second insulating layer 13 in the vias are etched away to expose the surface of the active layer 12.

Figure 13:
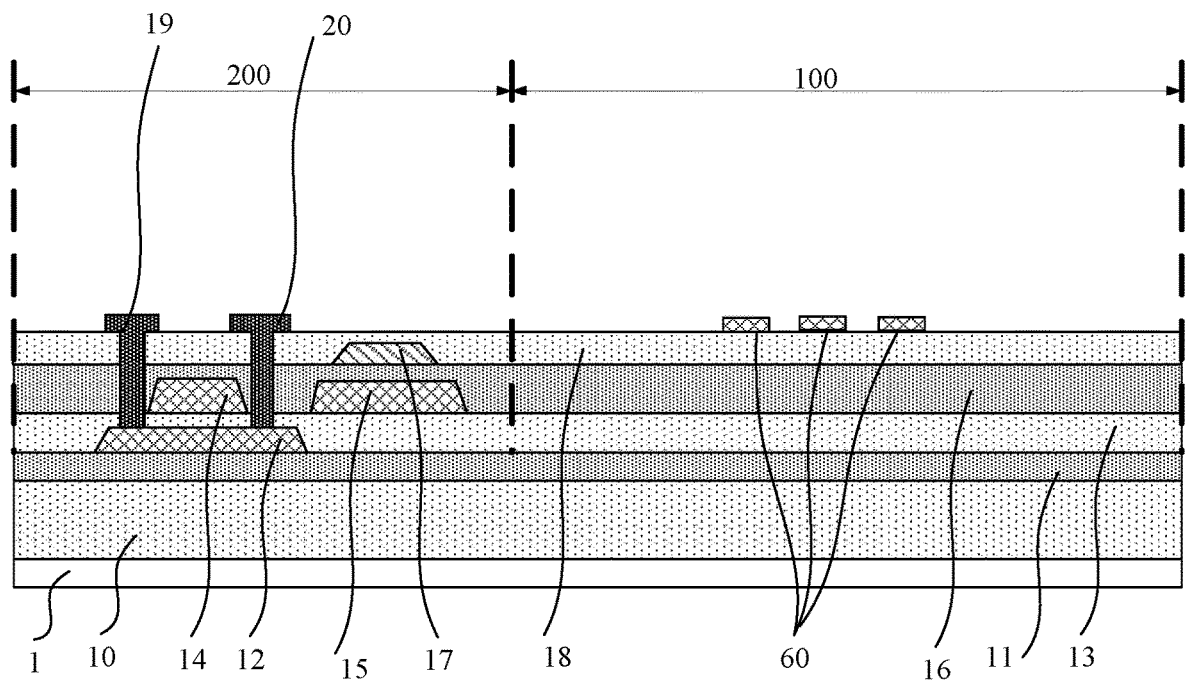
FIG. 13 is a schematic diagram of a display substrate according to another embodiment.

Depositing a third metal film, and patterning the third metal thin film through a patterning process to form a first source-drain metal layer (SD1) on the fourth insulating layer 18, which at least includes a source electrode 19, a drain electrode 20, and first driving signal wires of the first driving signal wire group 60, a data wire (not shown), a power supply line (not shown), etc. The source electrode 19 and the drain electrode 20 are respectively connected to the active layer 12 through the fourth via. As shown in FIG. 13, the active layer 12, the gate electrode 14, the source electrode 19 and the drain electrode 20 form a thin film transistor, and the first capacitor electrode 15 and the second capacitor electrode 17 form a storage capacitor. In the present embodiment, the first driving signal wire group 60 includes three first driving signal wires, and the cross-section of the first driving signal wire of the anti-diffraction region 110 is sinusoidal on a plane parallel to the substrate.

The structure shown in the embodiments of the present disclosure and the preparation process thereof are merely an exemplary description. In an exemplary implementation, corresponding structures may be changed and patterning processes may be added or reduced according to actual needs. For example, the thin film transistor may be not only a top gate structure, but alternatively a bottom gate structure, or may be not only a dual gate structure, but alternatively a single gate structure. Other electrodes, leads and structural film layers may further be disposed in the light-emitting structure layer.

Figure 14:
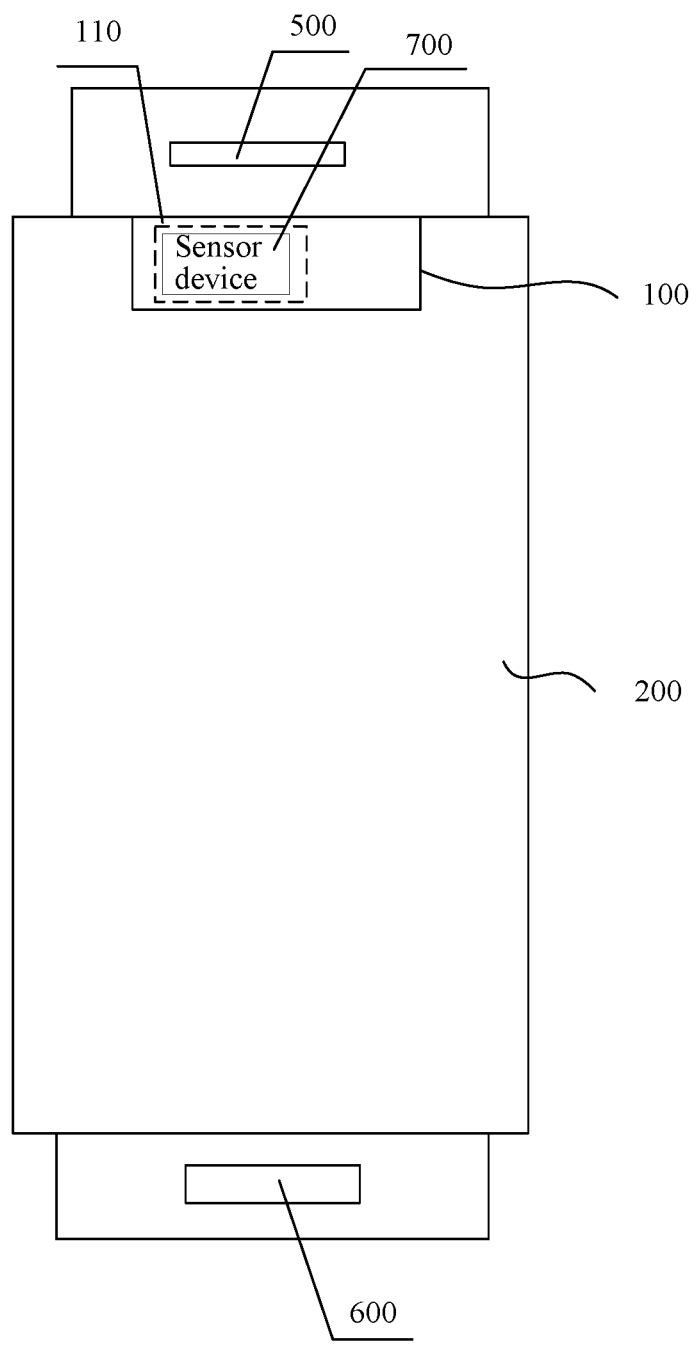
FIG. 14 is a schematic diagram of a display apparatus according to an embodiment.

As shown in FIG. 14, the present embodiment provides a display apparatus, which includes the aforementioned display substrate.

In an exemplary embodiment, the display apparatus may further include a first driving chip 500 and a second driving chip 600, wherein the first driving chip 500 is electrically connected to the passive light-emitting device (not shown) and the second driving chip 600 is electrically connected to the pixel drive circuit (not shown). The first driving chip 500 inputs a driving signal to the passive light-emitting device through a second driving signal wire (not shown), and the second driving chip 600 inputs a driving signal to the active light-emitting device through a pixel drive circuit. In the solution provided in the present embodiment, different driving chips are used to drive the first display region 100 and the second display region 200.

In an exemplary embodiment, the display apparatus may further include: a sensor device 700, at least one of which is disposed in the anti-diffraction region 110, and the photosensitive surface of the sensor device 700 is consistent with the light-emitting side of the display substrate. The sensor device 700 includes, for example, at least one of a camera, an infrared sensor, a face identification (Face ID) sensor, and the like.

In an exemplary embodiment, the display apparatus may include a full-screen display apparatus.

In an exemplary embodiment, a display apparatus may be any product or component with a display function such as a mobile phone, a tablet computer, a television, a display, a laptop computer, a digital photo frame, a navigator, etc.

Figure 15:
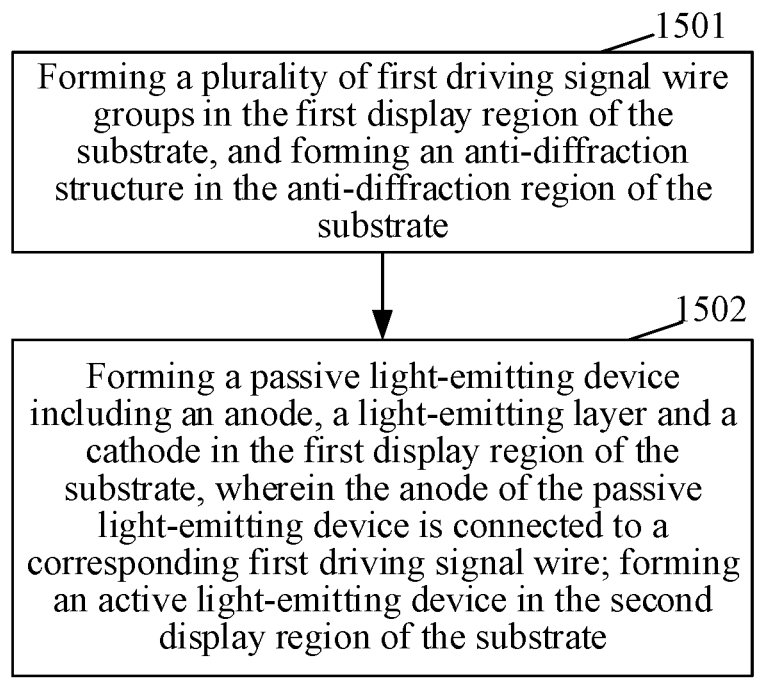
FIG. 15 is a flowchart of a preparation method of a display substrate according to an embodiment.

As shown in FIG. 15, an embodiment of the present disclosure further provides a preparation method of a display substrate including a first display region and a second display region; the first display region includes an anti-diffraction region, and the first display region includes a plurality of first pixels, wherein the first pixel includes a passive light-emitting device, the second display region includes a plurality of second pixels, wherein the second pixel includes an active light-emitting device and a pixel drive circuit electrically connected to the active light-emitting device; and the preparation method includes:

Step 1501, forming a plurality of first driving signal wire groups in the first display region of the substrate, and forming an anti-diffraction structure configured to reduce the diffraction intensity of the first driving signal wire group in the anti-diffraction region of the substrate, wherein one first driving signal wire group corresponds to a row of first pixels, and the first driving signal wire group includes a plurality of first driving signal wires; forming the pixel drive circuit in the second display region of the substrate;

Step 1502, forming a passive light-emitting device including an anode, a light-emitting layer and a cathode in the first display region of the substrate, wherein the anode of the passive light-emitting device is connected to a first driving signal wire corresponding the first driving signal group; forming an active light-emitting device in the second display region of the substrate. In an exemplary embodiment, forming an anti-diffraction structure in the anti-diffraction region of the substrate includes:

forming a plurality of shield parts on the substrate;

forming first driving signal wires of the first driving signal wire group on one side of the shield part away from the substrate, wherein the shield part corresponds to the first driving signal wire group one by one; on a direction parallel to the substrate, in the anti-diffraction region, an orthographic projection of the first driving signal wire of the first driving signal wire group is located in an orthographic projection of the corresponding shield part.

In an exemplary embodiment, the cross-sectional shape of the first driving signal wire in the anti-diffraction region includes a sinusoidal curve on a direction parallel to the substrate of the display substrate.

In the present embodiment, the structures, materials, relevant parameters and detailed preparation processes of various film layers have been described in detail in the above embodiments, and will not be described here again.

According to the solution provided in the present embodiment, the diffraction intensity is reduced by providing an anti-diffraction structure. The preparation method of the embodiment may be achieved by using existing mature preparation device, has small modification on the existing process, may be well compatible with the existing preparation process, and therefore has the advantages of low manufacturing cost, easy process realization, high product efficiency and high yield and the like. The solution provided by the present embodiment can reduce the diffraction intensity, improve the shooting effect, and has a good application prospect.

What is claimed is:

1. A display substrate, comprising:
a first display region and a second display region, wherein the first display region comprises a plurality of first pixels, wherein each first pixel comprises a passive light-emitting device, the second display region comprises a plurality of second pixels, wherein each second pixel comprises an active light-emitting device and a pixel drive circuit electrically connected to the active light-emitting device; the first display region comprises a plurality of first driving signal wire groups, one first driving signal wire group corresponds to a first pixel row; the first pixel row comprises one row of the first pixels, and the first driving signal group comprises a plurality of first driving signal wires, which is connected to an anode of the passive light-emitting device of the first pixel of a corresponding first pixel row; the first display region comprises an anti-diffraction region, which is provided with an anti-diffraction structure, and the anti-diffraction structure is configured to reduce the diffraction intensity of the first driving signal wire groups;
wherein the anti-diffraction structure comprises a plurality of shield parts, which correspond to the first driving signal wire groups one-to-one, and the shield parts are located on one side of the first driving signal wire groups close to a substrate of the display substrate; and
on a plane parallel to the substrate, in the anti-diffraction region, an orthographic projection of a first driving signal wire of the first driving signal wire group is located in an orthographic projection of a corresponding shield part.

2. The display substrate according to claim 1, wherein the pixel drive circuit comprises a gate electrode, a first capacitor electrode, a second capacitor electrode, a source electrode and a drain electrode, wherein the first capacitor electrode and the second capacitor electrode form a storage capacitor, the first driving signal wire is disposed in a same layer as the source electrode and the drain electrode, and the shield part is disposed in a same layer as the second capacitor electrode.

3. The display substrate according to claim 1, wherein the first driving signal wire group further comprises a connecting lead connecting the first driving signal wire and the anode of the passive light-emitting device through a via hole.

4. The display substrate according to claim 1, wherein the anti-diffraction region comprises N rows of first pixels and N shield parts corresponding to the N rows of first pixels one by one;
on a plane parallel to the substrate, a i-th distance between a first boundary of an orthographic projection of a i-th shield part and an orthographic projection of a reference line of a first pixel row corresponding to the i-th shield part is the same as a (K+i)-th distance between a first boundary of an orthographic projection of the (K+i)-th shield part and an orthographic projection of a reference line of the first pixel row corresponding to the (K+i)-th shield part; and distances between the first boundaries of orthographic projections of consecutive K shield parts and orthographic projections of the reference lines of first pixel rows corresponding to the shield parts are different from each other, wherein K is a preset value, i is 1 to N-K, and K is less than N; the reference line of the first pixel row is parallel to a first direction and comprises a boundary point of a pixel opening region of the first pixel row closest to a first side of the first display region; the first boundary is a boundary of the shield part close to the first side, and the first direction is a extending direction of the first pixel row.

5. The display substrate according to claim 4, wherein the K is greater than or equal to 8.

6. The display substrate according to claim 5, wherein in a case that K=8, on a plane parallel to the substrate, a distance between a first boundary of an orthographic projection of a first shield part and an orthographic projection of a reference line of a first pixel row corresponding to the first shield part is 107/127±10% reference units;
a distance between a first boundary of an orthographic projection of a second shield part and an orthographic projection of a reference line of a first pixel row corresponding to the second shield part is 117/127±10% reference units;
a distance between a first boundary of an orthographic projection of a third shield part and an orthographic projection of a reference line of a first pixel row corresponding to the third shield part is 90/127±10% reference units;
a distance between a first boundary of an orthographic projection of the fourth shield part and an orthographic projection of a reference line of a first pixel row corresponding to the fourth shield part is 118/127±10% reference units;
a distance between a first boundary of an orthographic projection of a fifth shield part and an orthographic projection of a reference line of a first pixel row corresponding to the fifth shield part is 75/127±10% reference units;
a distance between a first boundary of an orthographic projection of a sixth shield part and an orthographic projection of a reference line of a first pixel row corresponding to the sixth shield part is 118/127±10% reference units;
a distance between a first boundary of an orthographic projection of a seventh shield part and an orthographic projection of a reference line of a first pixel row corresponding to the seventh shield part is 59/127±10% reference units;

a distance between a first boundary of an orthographic projection of a eighth shield part and an orthographic projection of a reference line of a first pixel row corresponding to the eighth shield part is 91/127±10% reference units; and the reference unit is determined according to a size of an orthographic projection of the first pixel parallel to the substrate.

7. The display substrate according to claim 3, wherein the first driving signal wire group comprises three first driving signal wires, wherein the first pixel comprises a first color sub-pixel, a second color sub-pixel and a third color sub-pixel, and the anodes of the passive light-emitting devices of same color sub-pixels of the first pixels in a same row are electrically connected to one of the first driving signal wires.

8. The display substrate according to claim 7, wherein the first color sub-pixel and the second color sub-pixel are disposed in a same row, and the third color sub-pixel is located in a row adjacent to a row where the first color sub-pixel and the second color sub-pixel are located; the row where the first color sub-pixel is located and a row where the third color sub-pixel is located are alternately disposed in the first display region; and on a direction parallel to the substrate, in a same first pixel, in a case that the shortest distance between the first driving signal wire and a pixel opening region of the passive light-emitting device of the first pixel is larger than a preset distance, an orthographic projection of a connecting lead connected to the first driving signal wire is overlapped with an orthographic projection of a pixel opening region of the third color sub-pixel of the first pixel.

9. The display substrate according to claim 1, wherein the anti-diffraction structure comprises the first driving signal wire groups, and a cross-sectional shape of the first driving signal wire in the anti-diffraction region comprises a sinusoidal curve on a direction parallel to the substrate of the display substrate.

10. The display substrate according to claim 9, wherein in a same first driving signal wire group, the first driving signal wires are parallel to each other, the distances between adjacent first driving signal wires are the same, and the widths of the first driving signal wires are the same.

11. The display substrate according to claim 10, wherein on a direction parallel to the substrate, a distance between a starting point and an ending point of the sinusoidal curve in one cycle is 0.9 to 1.1 reference units, and an amplitude of the sinusoidal curve is 10/127±10% reference units, and the reference units are determined according to a size of an orthographic projection of the first pixel on a plane parallel to the substrate.

12. The display substrate according to claim 11, wherein the widths of the first driving signal wire is 6.2/127±10% reference units.

13. The display substrate according to claim 11, wherein the distance of the adjacent first driving signal wire is 5.8/127±10% reference units.

14. The display substrate according to claim 8, wherein the first pixel comprises a first color sub-pixel, a second color sub-pixel and a third color sub-pixel; the first color sub-pixel and the second color sub-pixel are disposed in a same row, and the third color sub-pixel is located in a row adjacent to a row where the first color sub-pixel and the second color sub-pixel are located;

the row where the first color sub-pixel is located and a row where the third color sub-pixel is located are alternately disposed in the first display region; and on a plane parallel to the substrate, an orthographic projection of the first driving signal wire group is overlapped with an orthographic projection of a pixel opening region of the first color sub-pixel and an orthographic projection of a pixel opening region of the second color sub-pixel of a corresponding first pixel row, and the orthographic projection of the first driving signal wire group is located outside the orthographic projection of the pixel opening region of the third color sub-pixel.

15. A display apparatus, comprising the display substrate of claim 1.

16. The display apparatus according to claim 15, further comprising: a sensor device, at least one of which is disposed in the anti-diffraction region and the photosensitive surface of the sensor device is same as light-emitting side of the display substrate.

17. A preparation method for a display substrate, wherein the display substrate comprises a first display region and a second display region; the first display region comprises an anti-diffraction region, and the first display region comprises a plurality of first pixels, wherein each first pixel comprises a passive light-emitting device, the second display region comprises a plurality of second pixels, wherein each second pixel comprises an active light-emitting device and a pixel drive circuit electrically connected to the active light-emitting device; and the preparation method comprises:

forming a plurality of first driving signal wire groups in the first display region of the substrate, and forming an anti-diffraction structure configured to reduce a diffraction intensity of the first driving signal wire groups in the anti-diffraction region of the substrate, wherein one first driving signal wire group corresponds to a row of first pixels, and the first driving signal wire group comprises a plurality of first driving signal wires;

forming the pixel drive circuit in the second display region of the substrate; and forming a passive light-emitting device comprising an anode, a light-emitting layer and a cathode in the first display region of the substrate, wherein the anode of the passive light-emitting device is connected to a first driving signal wire of a corresponding first driving signal group; forming an active light-emitting device in the second display region of the substrate, wherein forming the anti-diffraction structure in the anti-diffraction region of the substrate comprises:

forming a plurality of shield parts on the substrate; and forming first driving signal wires of the first driving signal wire group on one side of the shield parts away from the substrate, wherein the shield parts correspond to the first driving signal wire groups one by one; on a plane parallel to the substrate, in the anti-diffraction region, an orthographic projection of the first driving signal wire of the first driving signal wire group is located in an orthographic projection of a corresponding shield part.

18. The preparation method according to claim 17, wherein a cross-sectional shape of the first driving signal wire in the anti-diffraction region comprises a sinusoidal curve on a direction parallel to the substrate of the display substrate.

* * * * *